United States Patent
Lee et al.

(10) Patent No.: US 9,632,152 B2
(45) Date of Patent: Apr. 25, 2017

(54) PHASED ARRAY RF COIL MODULE AND MAGNETIC RESONANCE IMAGING APPARATUS USING THE SAME

(71) Applicants: Samsung Electronics Co., Ltd., Gyeonggi-do (KR); University-Industry Cooperation Group of Kyung Hee University, Seoul (KR)

(72) Inventors: Ju Hyung Lee, Gyeonggi-do (KR); Soo Yeol Lee, Gyeonggi-do (KR)

(73) Assignees: Samsung Electronics Co., Ltd., Yeongtong-gu, Suwon-si, Gyeonggi-do (KR); University-Industry Cooperation Group of Kyung Hee University, Hoegi-Dong, Dongdaemun-gu, Seoul (KR)

( * ) Notice: Subject to any disclaimer, the term of this patent is extended or adjusted under 35 U.S.C. 154(b) by 701 days.

(21) Appl. No.: 14/067,124

(22) Filed: Oct. 30, 2013

(65) Prior Publication Data

US 2014/0159727 A1     Jun. 12, 2014

(30) Foreign Application Priority Data

Dec. 11, 2012   (KR) .................. 10-2012-0143679

(51) Int. Cl.
  *G01R 33/34*     (2006.01)
  *G01R 33/341*    (2006.01)
  *G01R 33/3415*   (2006.01)

(52) U.S. Cl.
  CPC ..... *G01R 33/34092* (2013.01); *G01R 33/341* (2013.01); *G01R 33/3415* (2013.01)

(58) Field of Classification Search
  CPC ............ G01R 33/34092; G01R 33/341; G01R 33/3415
  See application file for complete search history.

(56) References Cited

U.S. PATENT DOCUMENTS 4,752,738 A   6/1988 Patrick et al.
5,293,519 A   3/1994 Yoshino et al.
(Continued)

FOREIGN PATENT DOCUMENTS

DE  10 2005 036 513 A1  8/2006
WO     2007/108190 A1   9/2007

OTHER PUBLICATIONS

Hamamura et al.; "An 8 channel shoulder coil for high resolusion imaging"; Proc. Intl. Soc. Mag. Reson. Med. 14; 2006.
(Continued)

*Primary Examiner* — Rodney Bonnette
(74) *Attorney, Agent, or Firm* — Cha & Reiter, LLC

(57) ABSTRACT

A phased array RF coil module and an imaging apparatus using the same can receive a magnetic resonance signal generated from a target object at high receive sensitivity and improve a signal to noise ratio. The phased array RF coil module includes at least one first phased array RF coil unit generating a magnetic field having a component horizontal with the surface of a target object and a second phased array RF coil unit formed horizontally with the surface of the target object and generating a magnetic field having a component vertical to the surface of the target object. The imaging apparatus using the phased array RF coil module is a magnetic resonance imaging apparatus.

29 Claims, 33 Drawing Sheets

(56) References Cited

U.S. PATENT DOCUMENTS

| | | | |
|---|---|---|---|
| 5,389,880 A * | 2/1995 | Mori | G01R 33/34061 |
| | | | 324/318 |
| 5,777,474 A * | 7/1998 | Srinivasan | G01R 33/34046 |
| | | | 324/318 |
| 6,313,633 B1 | 11/2001 | Boskamp | |
| 2005/0024054 A1 | 2/2005 | Rinneberg et al. | |
| 2008/0007250 A1 | 1/2008 | Wiggins | |
| 2010/0121180 A1 | 5/2010 | Biber et al. | |

OTHER PUBLICATIONS

Wiggins et al.; "32-Channel 3 Telsa Receive-Only Phased-Array Head Coil with Soccer-Ball Element Geometry"; Mar. 16, 2006; Wiley-Liss, Inc.

Kirilina et al.; "The novel 12 channel octahedral transmit/receive array for parallel imaging of human head at 3 T"; Proc. Intl. Soc. Mag. Reson. Med. 15; 2007.

You et al.; "3D-Orthogonal Phased Array Coil for High-Resolution and Low-distortion EPI Imaging of Monkey Brain at 3.0T"; Proc. Intl. Soc. Mag. Reson. Med. 15; 2007.

Gilbert et al.; "A 16-Channel Conformal Transceive Coil for 7-T Neuroimaging"; Proc. Intl. Soc. Mag. Reson. Med. 19; 2011.

Arpinar et al.; "Novel RF coil array designs to improve SNR in dorsal areas of the brain"; Proc. Intl. Soc. Mag. Reson. Med. 20; 2012.

Zheng et al.; "A 3.0T Flexible Transmit and 16 Channel Receive Array Shoulder Coil"; Proc. Intl. Soc. Mag. Reson. Med. 20; 2012.

Yang et al.; "An Optimized "QD-like" 6-Channel Flexible and Ergonomic Shoulder Array Coil at 1.5T"; XP55103775A, Jan. 2010.

* cited by examiner

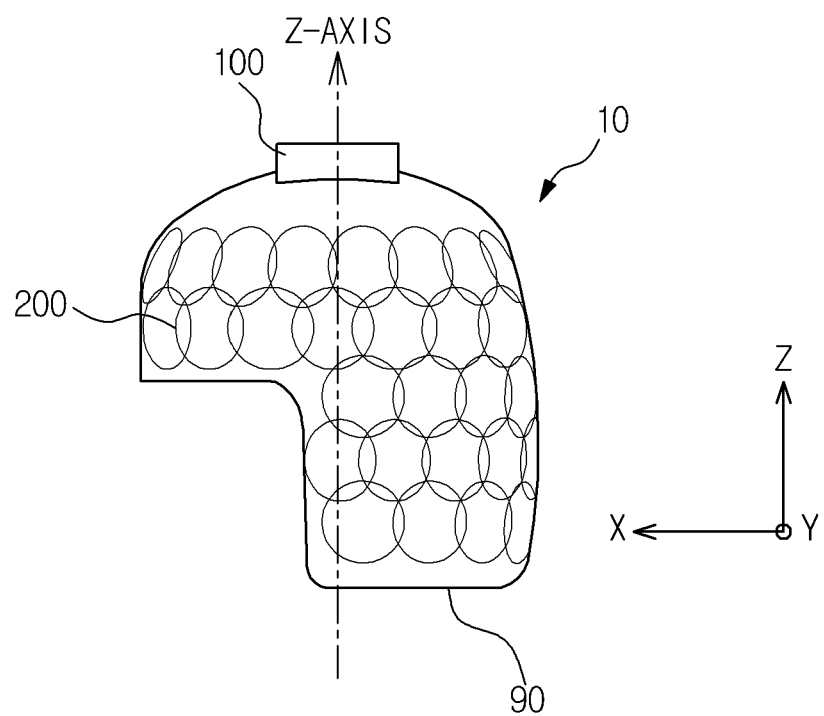

PHASED ARRAY RF COIL MODULE AND MAGNETIC RESONANCE IMAGING APPARATUS USING THE SAME

CROSS-REFERENCE TO RELATED APPLICATIONS

This application claims the benefit of priority from Korean Patent Application No. 10-2012-0143679, filed on Dec. 11, 2012 in the Korean Intellectual Property Office, the disclosure of which is incorporated herein by reference in its entirety.

BACKGROUND

1. Field of the Invention

The present disclosure relates to a phased array RF coil module and an imaging apparatus using the same.

2. Description of the Related Art

An imaging apparatus, such as a magnetic resonance imaging (MRI) apparatus, a digital radiography (DR) apparatus, an ultrasonic diagnostic apparatus or a computed tomography (CT) apparatus, acquires information regarding an inner structure of a target object, for example, a human body, and generates a visible image based on the acquired information, and provides such an image to a user.

In order to image the internal cross-section of a target object, for example, a human body, the magnetic resonance imaging apparatus utilizes nuclear magnetic resonance (NMR) in which atomic nuclei resonate with electromagnetic waves of a designated frequency.

Atomic nuclei of elements of hydrogen (H), phosphorous (P), sodium (Na) or various carbon isotopes at the inside of a target object, for example, a human body, all have particles with characteristics called spins. Therefore, if atomic nuclei are exposed to an external magnetic field, i.e., a static magnetic field, and are thus magnetized, spins of the atomic nuclei are arranged in the direction of the magnetic field and are rapidly rotated at a designated angle to a central axis by torque received from the magnetic field, and such a phenomenon is referred to as precession. A frequency of precession, which is also known by persons of ordinary skill the art as also being referred to as a Larmor frequency. Such a Larmor frequency is proportional to the intensity of the static magnetic field. When electromagnetic waves of a frequency equal to or similar to the Larmor frequency are applied to the above-described atomic nuclei, a magnetization vector of the atomic nuclei resonates and is thus oriented orthogonally to the static magnetic field. At this time, the magnetization vector induces a voltage signal, generally referred to a free induction decay (FID) signal, on neighboring RF coils. The magnetic resonance imaging apparatus generates an inner image of a target object, for example, a human body, from the induced voltage signal, and provides the generated image to a user.

Since the magnetic resonance imaging apparatus mainly images the distribution of hydrogen atoms, the magnetic resonance imaging apparatus can be advantageous in observation in a human body having a large number of hydrogen atoms.

SUMMARY

Therefore, it is an exemplary aspect of the present invention to provide a phased array RF coil module having high a high receiving (receive) sensitivity in applying electromagnetic waves to a target object or receiving a magnetic resonance signal generated from the target object, and a magnetic resonance imaging apparatus using the phased array RF coil module.

It is another exemplary aspect of the present invention to provide a phased array RF coil module having a high receiving (receive) sensitivity to improve a signal-to noise ratio of an output image of a magnetic resonance imaging apparatus, and a magnetic resonance imaging apparatus using the phased array RF coil module.

It is another exemplary aspect of the present invention to provide a phased array RF coil module which prevents lowering of a signal-to-noise ratio generated when phased array RF coils including only loop coils are used, and a magnetic resonance imaging apparatus using the phased array RF coil module.

It is a further exemplary aspect of the present invention to provide a phased array RF coil module which reduces an imaging time in magnetic resonance imaging, and a magnetic resonance imaging apparatus using the phased array RF coil module.

Additional exemplary aspects of the present invention will be set forth in part in the description which follows and can flow logically to a person of ordinary skill in the art from the description, or can be learned by practice of the invention without undue experimentation.

In accordance with an exemplary aspect of the present invention, a phased array RF coil module includes at least one first phased array RF coil unit generating a magnetic field having a component horizontal with the surface of a target object, and a second phased array RF coil unit generating a magnetic field having a component vertical to the surface of the target object.

The at least one first phased array RF coil unit can include two conductor surfaces electrically connected to each other and disposed opposite to each other.

The at least one first phased array RF coil unit can include at least one conductor surface and a conductor wire group formed by arranging plural conductor wires in parallel, and the at least one conductor surface and the conductor wire group can be electrically connected to each other and disposed (arranged) opposite to each other.

The at least one first phased array RF coil unit can include, for example, a first conductor wire group formed by arranging a first plurality of conductor wires in parallel and a second conductor wire group formed by arranging a second plurality of conductor wires in parallel, and the first conductor wire group and the second conductor wire group can be electrically connected to each other and disposed opposite to each other.

The at least one first phased array RF coil unit can include two loop structures disposed adjacent to each other so as to form magnetic fields in opposite directions, and the at least one first phased array RF coil unit can include at least one conductor wire formed in a figure eight shape.

The second phased array RF coil unit can include plural loop coils combined with each other.

The at least one first phased array RF coil unit and the second phased array RF coil unit can be combined, for example, in a helmet shape. In this case, the at least one first phased array RF coil unit can be formed at the parietal region of the helmet shape.

The at least one first phased array RF coil unit and the second phased array RF coil unit can be combined in a shoulder and chest guard shape. In this case, the at least one first phased array RF coil unit can be formed at the shoulder region of the shoulder and chest guard shape.

The at least one first phased array RF coil unit or the second phased array RF coil unit can apply electromagnetic waves to the target object, or receive a magnetic resonance signal from the target object.

In accordance with another exemplary aspect of the present invention, a phased array RF coil module includes at least one first phased array RF coil unit generating a magnetic field having a component substantially orthogonal to an external magnetic field around a target object exposed to the external magnetic field, and a second phased array RF coil unit generating a magnetic field having a component vertical to the surface of the target object. Here, the at least one first phased array RF coil unit and the second phased array RF coil unit can be combined in a helmet shape, and the at least one first phased array RF coil unit can be formed at the parietal region of the helmet shape.

In accordance with another exemplary aspect of the present invention, a magnetic resonance imaging apparatus includes a static magnetic field coil unit forming a static magnetic field around a target object, and an RF coil unit applying electromagnetic waves to the target object around which the static magnetic field is formed to induce magnetic resonance in the target object, and receiving a magnetic resonance signal generated according to magnetic resonance. In this case, the RF coil unit can include at least one first phased array RF coil unit generating a magnetic field having a component horizontal to the surface of the target object, and a second phased array RF coil unit generating a magnetic field having a component vertical to the surface of the target object.

The at least one first phased array RF coil unit can include two conductor surfaces electrically connected to each other and disposed opposite to each other.

The at least one first phased array RF coil unit can include at least one conductor surface and a conductor wire group formed by arranging a plurality of conductor wires in parallel, and the at least one conductor surface and the conductor wire group can be electrically connected to each other and disposed opposite to each other.

The at least one first phased array RF coil unit can include a first conductor wire group formed by arranging plural conductor wires in parallel and a second conductor wire group formed by arranging plural conductor wires in parallel, and the first conductor wire group and the second conductor wire group can be electrically connected to each other and disposed opposite to each other.

The at least one first phased array RF coil unit can include two loop structures disposed adjacent to each other so as to form magnetic fields in opposite directions. In this case, the at least one first phased array RF coil unit can include at least one conductor wire formed in, for example, a figure eight shape.

The second phased array RF coil unit can include a plurality of loop coils combined with each other.

The at least one first phased array RF coil unit and the second phased array RF coil unit can be combined in a helmet shape. In this case, the at least one first phased array RF coil unit can be formed at the parietal region of the helmet shape.

The at least one first phased array RF coil unit or the second phased array RF coil unit can apply electromagnetic waves to the target object, or receive a magnetic resonance signal from the target object.

In accordance with a further exemplary aspect of the present invention, a magnetic resonance imaging apparatus includes a static magnetic field coil unit forming a static magnetic field around a target object, and an RF coil unit including at least one first phased array RF coil unit generating a magnetic field having a component orthogonal to the static magnetic field and a second phased array RF coil unit generating a magnetic field having a component vertical to the surface of the target object.

In this exemplary aspect of the invention, the at least one first phased array RF coil unit and the second phased array RF coil unit can be combined in a helmet shape, and the at least one first phased array RF coil unit can be formed at the parietal region of the helmet shape.

Further, the at least one first phased array RF coil unit and the second phased array RF coil unit can be combined in a shoulder and chest guard shape. In this case, the at least one first phased array RF coil unit can be formed at the shoulder region of the shoulder and chest guard shape.

BRIEF DESCRIPTION OF THE DRAWINGS

These and/or other exemplary aspects of the invention will become more readily appreciated by a person of ordinary skill in the art from the following description of the exemplary embodiments, taken in conjunction with the accompanying drawings of which:

FIGS. 2a, 2b and 2c are perspective, front and side views of a phased array RF coil module in accordance with an exemplary embodiment of the present invention;

DETAILED DESCRIPTION

Figure 1:
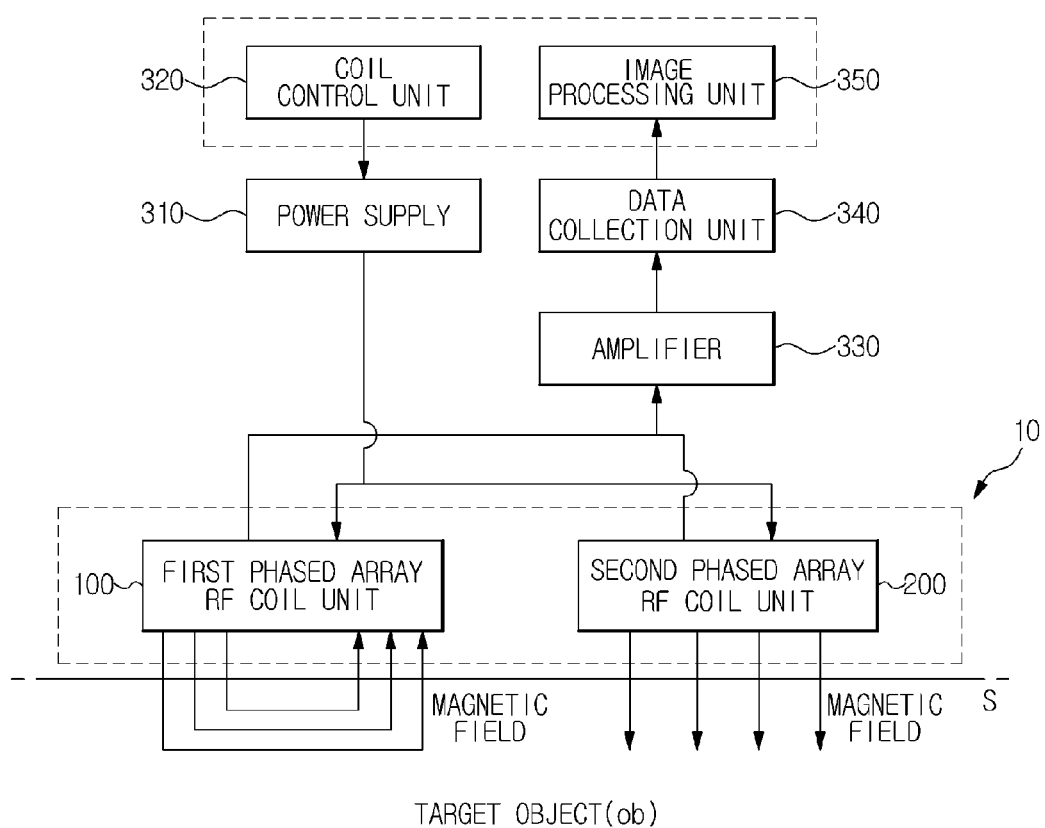
FIG. 1 is a view illustrating the configuration of a phased array RF coil module in accordance with an exemplary embodiment of the present invention.

Reference will now be made in detail to the exemplary embodiments of the present invention, examples of which are illustrated in the accompanying drawings, wherein like reference numerals refer to like elements throughout.

FIG. 1 is a view illustrating the configuration of a phased array RF coil module in accordance with an exemplary embodiment of the present invention.

As shown in FIG. 1, a phased array RF coil module 10 in accordance with this exemplary embodiment of the present invention can include a first phased array RF coil unit 100 and a second phased array RF coil unit 200.

The first phased array RF coil unit 100 generates a magnetic field having a component horizontal with the surface (s) of a target object (ob) or in a direction substantially horizontal with the surface (s) of the target object (ob). In other words, magnetic force lines of the magnetic field generated by the first phased array RF coil unit 100 are expressed parallel with the surface (s) of the target object (ob), as shown in FIG. 1.

However, in this case, the magnetic field generated by the first phased array RF coil unit 100 is not always horizontal (or substantially horizontal) with the surface(s) of the target object (ob) in all regions. For example, in case of a magnetic field incident upon the target object (ob), a portion of the magnetic field can have a component in a direction vertical to the surface(s) of the target object (ob). However, the magnetic field generated by the first phased array RF coil unit 100 generally has a component horizontal with the surface (s) of the target object (ob).

Accordingly, when RF current of a Larmor frequency band is applied to the first phased array RF coil unit 100, a rotary magnetic field rotated at the Larmor frequency is generated in the first phased array RF coil unit 100, and the main component of such a magnetic field is horizontal with the surface(s) of the target object (ob). The magnetic field generated by the first phased array RF coil unit 100 causes nuclear magnetic resonance (NMR) of atomic nuclei in the target object (ob). Therefore, the first phased array RF coil unit 100 can be used in a transmission mode.

Further, the first phased array coil unit 100 can receive a magnetic resonance signal from the target object (ob). In other words, the first phased array RF coil unit 100 can be used in a reception mode.

When nuclear magnetic resonance (NMR) of the atomic nuclei in the target object (ob) is caused, as described above, a magnetization vector of the atomic nuclei is rotated at the Larmor frequency on one plane. The above-rotated magnetization vector generates electromotive force in the first phased array RF coil unit 100 according to Faraday's law. An electrical signal flowing in the first phased array RF coil unit 100 based on the electromotive force becomes a magnetic resonance signal.

The second phased array RF coil unit 200 generates a magnetic field vertical to the surface (s) of the target object (ob) or in a direction almost vertical to the surface (s) of the target object (ob). More particularly, magnetic force lines of the magnetic field generated by the second phased array RF coil unit 200 are expressed orthogonally to the surface(s) of the target object (ob), as shown in FIG. 1.

However, in this case, the magnetic field generated by the second phased array RF coil unit 200 cannot always include only a component vertical to the surface (s) of the target object (ob) in all regions. A portion of the magnetic field can have a designated angle to a line, or a plane orthogonal to the surface(s) of the target object (ob). However, the magnetic field generated by the second phased array RF coil unit 200 mainly has a component vertical to the surface (s) of the target object (ob).

In the same manner as the first phased array RF coil unit 100, when RF current of the Larmor frequency band is applied to the second phased array RF coil unit 200, the second phased array RF coil unit 200 generates a magnetic field having a component in the vertical direction to the surface (s) of the target object (ob). The magnetic field generated by the second phased array RF coil unit 200 can also cause nuclear magnetic resonance (NMR) of the atomic nuclei in the target object (ob).

Further, the second phased array RF coil unit 200 can receive a magnetic resonance signal from the target object (ob). Thereby, in the same manner as reception of the magnetic resonance signal by the first phased array RF coil unit 100, the second phased array RF coil unit 200 can receive a nuclear magnetic resonance signal based on electromotive force generated by the second phased array RF coil unit 200 by nuclear magnetic resonance (NMR) induced in the atomic nuclei in the target object (ob).

As shown in FIG. 1, the first phased array RF coil unit 100 and the second phased array RF coil unit 200 of the phased array RF coil module 10 can be connected to a power source such as power supply 310. The power supply 310 supplies current to the first phased array RF coil unit 100 and the second phased array RF coil unit 200, thus causing the first phased array RF coil unit 100 and the second phased array RF coil unit 200 to generate magnetic fields having a component in the horizontal direction and a component in the vertical direction. The power supply 310 can apply RF current of the Larmor frequency band to the first phased array RF coil unit 100 and to the second phased array RF coil unit 200.

A coil control unit 320 controls the power supply 310 so that the power supply 310 either (1) supplies current to the first phased array RF coil unit 100 and the second phased array RF coil unit 200 or shuts off the supply of power to the first phased array RF coil unit 100 and the second phased array RF coil unit 200. Further, the coil control unit 320 can control the intensity of current supplied to the first phased array RF coil unit 100 and the second phased array RF coil unit 200.

The first phased array RF coil unit 100 and the second phased array RF coil unit 200 can be connected to an amplifier 330 or a data collection unit 340 according to the exemplary embodiments.

The amplifier 330 amplifies the magnetic resonance signal received by the first phased array RF coil unit 100 or the second phased array RF coil unit 200. The magnetic resonance signal received by the first phased array RF coil unit 100 or the second phased array RF coil unit 200 can be very weak. Therefore, the amplifier 330 amplifies the magnetic resonance signal to a proper intensity, i.e., an intensity amplified usually when an ordinary MRI apparatus is in operation. A low noise pre-amplifier can be used as the amplifier 330 according to the exemplary embodiments.

The data collection unit 340, which comprises non-transitory machine readable storage, collects information regarding the target object (ob), for example, the inside of a human body, based on the magnetic resonance signal transmitted to the first phased array RF coil unit 100, the second phased array RF coil unit 200 or the amplifier 330, or the amplified magnetic resonance signal, and temporarily or non-temporarily stores the information, as needed.

An image processing unit 350 includes circuitry such as a processor or microprocessor and generates a magnetic resonance image based on the magnetic resonance signal or the amplified magnetic resonance signal collected by the data collection unit 340 or stored in the data collection unit 340. Note that the collected data is an data collected by the data collection unit 340, and the stored data is the collected data stored in the storage temporally or non-temporally as needed. The magnetic resonance image generated by the image processing unit 350 is displayed to a user so that the user can visually confirm the inner tissues, materials and structures of the target object (ob).

Hereinafter, the above-described phased array RF coil module 10 will now be described in detail.

Figure 2A:
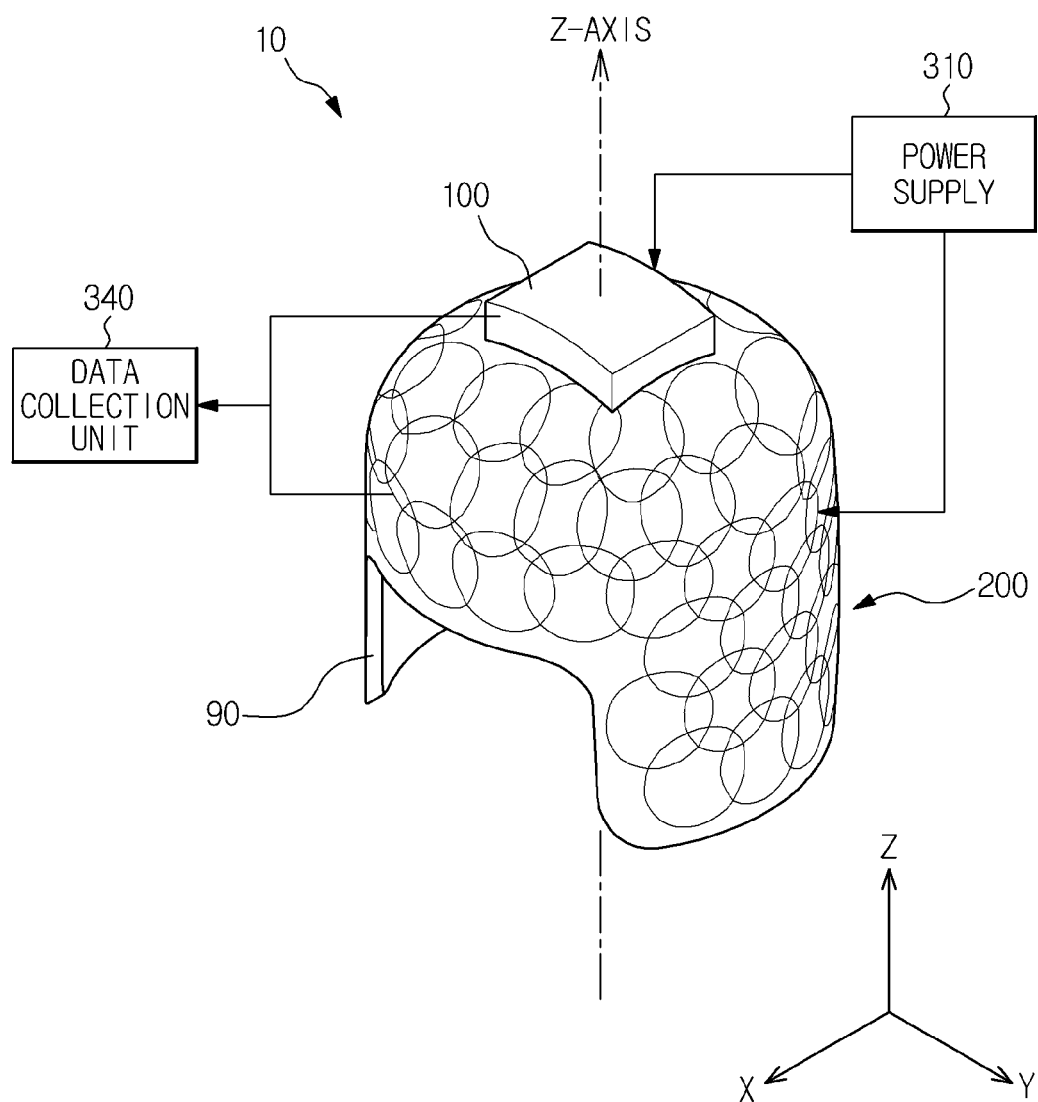
Figure 2B:
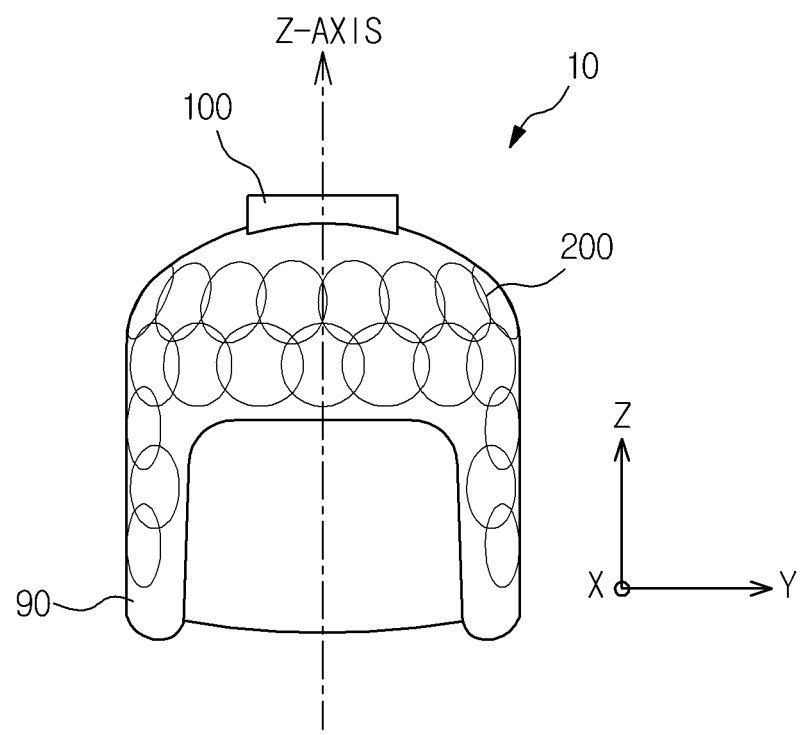

FIGS. 2a, 2b, and 2c are views of a phased array RF coil module in accordance with an exemplary embodiment of the present invention.

As shown in FIGS. 2a, 2b and 2c, the phased array RF coil module 10 can have a helmet shape. That is, the first phased array RF coil unit 100 and the second phased array RF coil unit 200 can be combined in a helmet shape. Here, we assume that a virtual line vertically passing through the upper end, i.e., the parietal region, of the helmet-shaped phased array RF coil module 10 is a Z-axis.

The helmet-shaped phased array RF coil module 10 can be used to image the inner tissues of the head of a human body, for example, a brain, if the head of the human body is the target object (ob). In more detail, the helmet-shaped phased array RF coil module 10 can be used in functional brain imaging or cerebral perfusion imaging. The helmet-shaped phased array RF coil module 10 surrounds the overall head, and can thus more precisely receive a large amount of magnetic resonance signals from the head.

In this case, if brain tissues are imaged using a magnetic resonance imaging apparatus, a target object, i.e., the head of a human body, is inserted into the helmet-shaped phased array RF coil module 10, and a static magnetic field is formed at the upper part of the helmet-shaped phased array RF coil module 10 along the Z-axis.

In accordance with the embodiment shown in FIGS. 2a to 2c, at least one first phased array RF coil unit 100 is disposed at the upper end, i.e., the parietal region, of the helmet-shaped phased array RF coil module 10, and a second phased array RF coil unit 200 is disposed at other regions than the parietal region.

If an external magnetic field, for example, the static magnetic field of the magnetic resonance imaging apparatus, is formed along the Z-axis and the first phased array RF coil unit 100 is located at the center of the parietal region, the main component of the magnetic field generated by the first phased array RF coil unit 100 can be orthogonal to the static magnetic field. That is, the first phased array RF coil unit 100 can generate a magnetic field having an X-axis or Y-axis directional component.

Figure 2D:
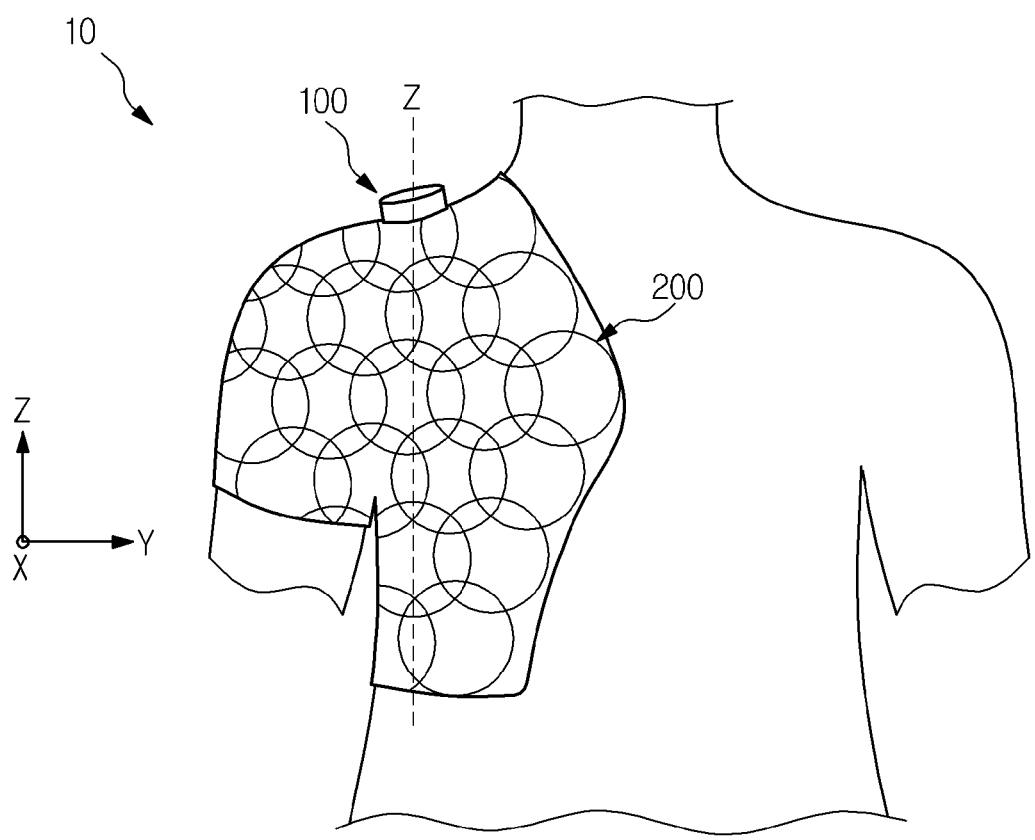
FIG. 2d is a front view of a phased array RF coil module in accordance with another exemplary embodiment of the present invention.

FIG. 2d is a front view of a phased array RF coil module in accordance with another exemplary embodiment of the present invention.

As shown in FIG. 2d, the phased array RF coil module 10 can be formed in a shoulder and chest guard shape mounted on the shoulder and chest of a human body. For example, the first phased array RF coil unit 100 and the second phased array RF coil unit 200 can be combined in a shoulder and chest guard shape and placed on the target. It is assumed in this particular example that a virtual line extended from the position of legs of the human body to the position of the head of the human body when the shoulder and chest guard-shaped phased array RF coil module 10 is mounted on the human body, in more detail, the shoulder or the chest, is a Z-axis.

The shoulder and chest guard-shaped phased array RF coil module 10 can be used to inspect the shoulder or tissues of the shoulder and chest region of a human, for example, the lungs, the heart, or the internal organs of the shoulder or chest region of a human body, such as shoulder muscles or ligaments, and articular cavities. An artisan understands and appreciates that similar structures that conform to the contour of different areas of the body are within the spirit and scoped of the claimed invention.

In more detail, the shoulder and chest guard-shaped phased array RF coil module 10 can generally cover the shoulder, the chest and the upper arm in magnetic resonance imaging, and thus receive a magnetic resonance signal from the shoulder or the chest.

A target object, i.e., the shoulder or the chest of a human body, is inserted into the shoulder and chest guard-shaped phased array RF coil module 10. Here, both the shoulder and the chest of a human body can be inserted into the shoulder and chest guard-shaped phased array RF coil module 10. If the magnetic resonance imaging apparatus is used to obtain an image the shoulder or the chest region of a human body, a static magnetic field is formed in the downward direction of FIG. 2d along the Z-axis.

In accordance with the exemplary embodiment shown in FIG. 2d, at least one first phased array RF coil unit 100 is disposed at the upper end, i.e., a region of the shoulder and chest guard-shaped phased array RF coil module 10 in which a virtual line orthogonal to the surface of the shoulder and chest guard-shaped phased array RF coil module 10 is parallel with the Z-axis or an angle between the virtual line and the Z-axis is sufficiently small, for example, the shoulder region of the shoulder and chest guard-shaped phased array RF coil module 10. In this case, a second phased array RF coil unit 200 can be disposed at other regions than the region where the first phased array RF coil unit 100 is disposed, for example, the region of the shoulder and chest guard-shaped phased array RF coil module 10 surrounding the chest part of the human body.

If an external magnetic field, for example, the static magnetic field of the magnetic resonance imaging apparatus, is formed along the Z-axis and the first phased array RF coil unit 100 is located at the shoulder region, the main component of the magnetic field generated by the first phased array RF coil unit 100 can be orthogonal to the static magnetic field. For example, the first phased array RF coil unit 100 can generate a magnetic field having an X-axis or Y-axis directional component, as shown in FIG. 2d.

The above-described first phased array RF coil unit 100 shown in FIGS. 2a to 2d is similar to a first phased array RF coil unit in accordance with another embodiment shown in FIGS. 4a and 4b, which will be described later, but is not limited thereto. The first phased array RF coil unit 100 disposed at the parietal region can be applied to respective embodiments, which will be illustrated through FIGS. 3a to 12.

The second phased array RF coil unit 200 can include a plurality of coil elements. The respective coil elements can be, for example, circular or hexagonal loop coils, as shown in FIGS. 2a, 2b and 2c.

Magnetic fields generated by the respective coil elements of the second phased array RF coil unit 200 can be parallel with or orthogonal to the external static magnetic field according to positions of the coil elements on the helmet-shaped phased array RF coil module 10. For example, the component of the magnetic field formed by the coil element of the second phased array RF coil unit 200 disposed close to the parietal region is formed in the direction of the target object (ob), for example, the head, is in parallel with the static magnetic field or at a slight angle (i.e. substantially parallel) to the static magnetic field. On the other hand, the component of the magnetic field formed by the coil element of the second phased array RF coil unit 200 disposed on the side surface of the helmet-shaped phased array RF coil module 10 is formed in the direction of the target object (ob) orthogonally to the static magnetic field or to the static magnetic field If the second phased array RF coil unit 200 is located at the parietal region in place of the first phased array RF coil unit 100, a magnetic field generated by the second phased array RF coil unit 200 can be formed in parallel with the external static magnetic field in the Z-axis direction in the same manner as the external static magnetic field. Receive sensitivity of the phased array RF coil 10 is determined only by the magnetic field having the component orthogonal to the static magnetic field. Therefore, if the second phased array RF coil unit 200 is located closest to the parietal region and thus generates a magnetic field horizontal with respect to the static magnetic field or almost horizontal with the static magnetic field, i.e., generates a magnetic field in the Z-axis direction, and the receive sensitivity to a magnetic resonance signal can be relatively low.

Therefore, if the first phased array RF coil unit 100 is disposed at the parietal region, as shown in FIGS. 2a to 2c, the first phased array RF coil unit 100 generates a magnetic field of a component vertical to the static magnetic field and thus the receive sensitivity to a magnetic resonance signal can be improved.

In generation of a magnetic resonance image using the phased array RF coil module 10, a magnetic resonance image of the parietal region is generated based on information regarding the target object (ob) acquired by the first phased array RF coil unit 100, and magnetic resonance images of other regions are acquired through the second phased array RF coil unit 200. Therefore, a signal to noise ratio of a finally generated magnetic resonance image can be improved.

The relative spatial positions of the respective coil elements of the second phased array RF coil unit 200 are different from each other. Therefore, the phases of magnetic resonance signals received by the respective coil elements are different. Accordingly, when an image is generated based on signals received by the respective coil elements of the second phased array RF coil unit 200, a signal to noise ratio of the image can be improved in consideration of the received phases of the coil elements.

The respective coil elements of the second phased array RF coil unit 200 can be arranged at uniform intervals. However, as shown in FIGS. 2a, 2b and 2c, the coil elements can be arranged such that neighboring coil elements overlap with each other so as to minimize electromagnetic coupling between the neighboring coil elements.

In order to stably hold the helmet shape of the phased array RF coil module 10, the phased array RF coil module 10 can include a helmet-shaped frame 90 (FIG. 2a) to which the first phased array RF coil unit 100 and the second phased array RF coil unit 200 are fixed. In this case, the helmet-shaped frame can be a housing provided with the first phased array RF coil unit 100 and the second phased array RF coil unit 200 installed at the inside or the outside thereof.

Hereinafter, first phased RF coil units in accordance with various exemplary embodiments will now be described.

Figure 3A:
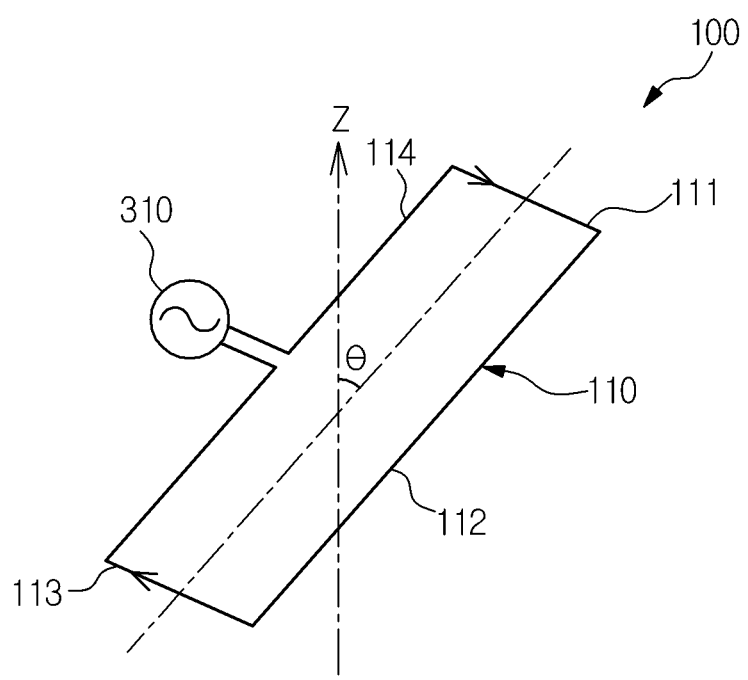
FIG. 3a is a view of a first phased array RF coil unit in accordance with an exemplary embodiment of the present invention.
Figure 3B:
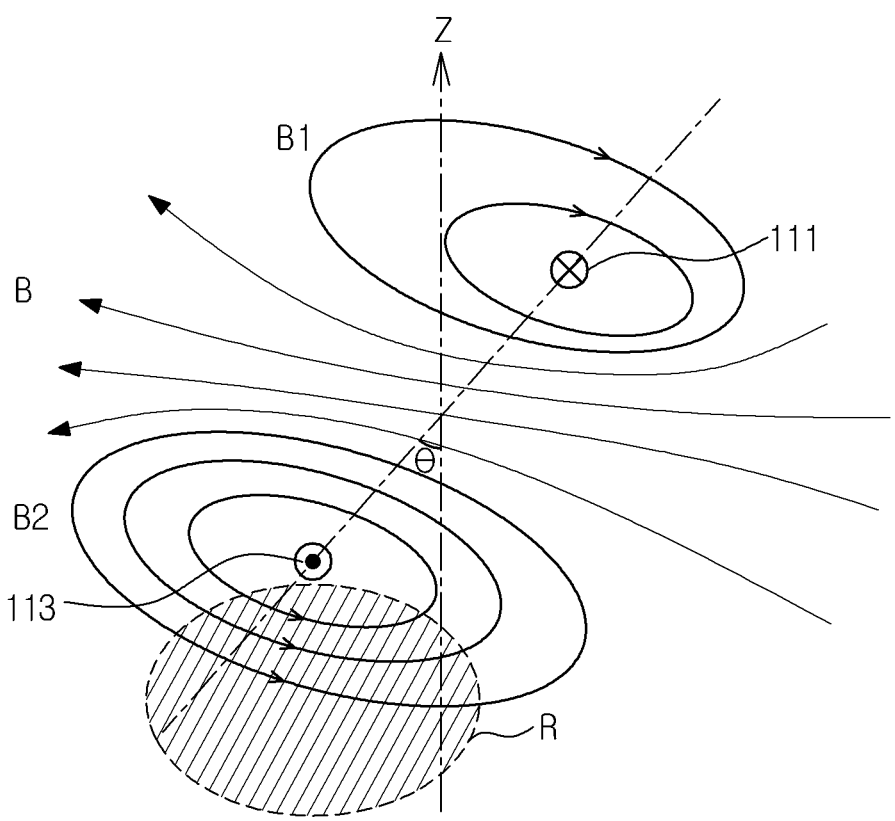
FIG. 3b is a view illustrating magnetic force lines generated by the first phased array RF coil unit in accordance with an exemplary embodiment of the present invention.

FIGS. 3a and 3b are views illustrating a first phased array RF coil unit in accordance with an exemplary embodiment of the present invention. As shown in FIGS. 3a and 3b, a first phased array RF coil unit 100 can include conductor wires 110 formed in a rectangular shape and inclined by a designated included angle $\theta$ to a designated axis, for example, the Z-axis. Here in this example, the designated included angle $\theta$ can be 0 degrees, or an angle (about −20 degree to 20 degree) close to 0 degrees. In case of the magnetic resonance imaging apparatus, the Z-axis direction can be the direction of the external magnetic field, for example, the direction of the static magnetic field.

When a current "I" supplied from the external power supply 310 is rotated along the conductor wires 111 to 114 in the clockwise direction, as shown in FIG. 3a, magnetic fields B, B1 and B2 are generated around the conductor wires 111 and 113 of the first phased array RF coil unit 100, as shown in FIG. 3b. According to the various exemplary embodiments, current I can be AC of the Larmor frequency, and in this case, the generated magnetic field can be an AC magnetic field having the same vibration frequency as the current I.

The generated magnetic fields B, B1 and B2 have an X-axis component and a Y-axis component vertical to the Z-axis, as shown in FIG. 3b. If the included angle is sufficiently small, for example, has a value close to 0 degrees, the component vertical to the Z-axis, for example, the X-axis component or the Y-axis component, of the magnetic field further increases. Since sensitivity to a magnetic resonance signal increases as the X-axis component or the Y-axis component increases, the receive sensitivity of the magnetic resonance signal can be sufficiently increased by the first phased array RF coil unit 100 including the conductor wires 110 formed in the rectangular shape. If the included angle is substantially about 90 degrees, the first phased array RF coil unit 100 becomes substantially identical with the second phased array RF coil unit 200, and thus the X-axis component or the Y-axis component becomes relatively very small. Therefore, only the Z-axis component substantially remains and thus receive sensitivity is not improved.

With continued reference to FIG. 3b, an imaging region "R" by the first phased array RF coil unit 100 is located within a portion of the magnetic field B2, generated by the conductor wire 113 located close to the target object (ob), in the direction of the target object (ob), for example, a portion of the magnetic field B2 located under the lower conductor wire 113 of FIG. 3b, among of the conductor wires 110. In other words, if the first phased array RF coil unit 100 is formed, as shown in FIGS. 3a and 3b, a magnetic field including a component vertical to the Z-axis, for example, a component vertical to the static magnetic field in the magnetic resonance imaging apparatus, i.e., a magnetic field including the X-axis component and the Y-axis component, is generated under the conductor wire 113, and thus a proper magnetic resonance imaging signal can be received.

Figure 4A:
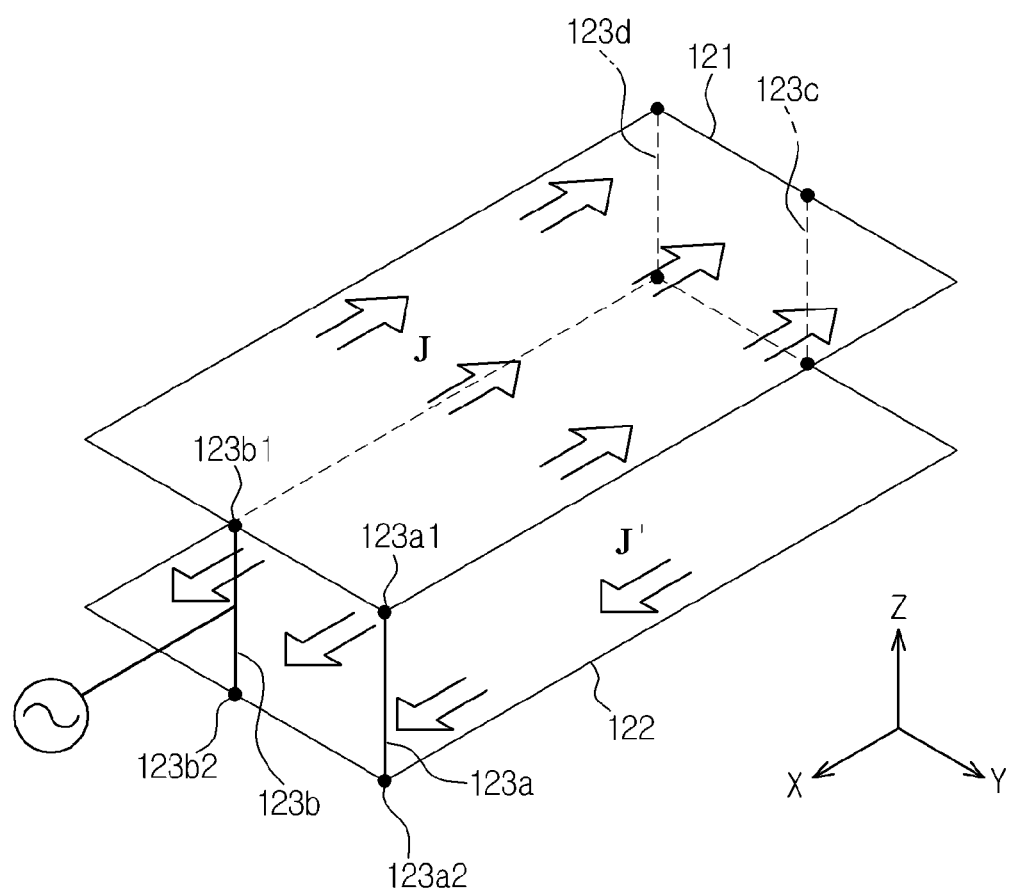
FIG. 4a is a view of a first phased array RF coil unit in accordance with another exemplary embodiment of the present invention.
Figure 4B:
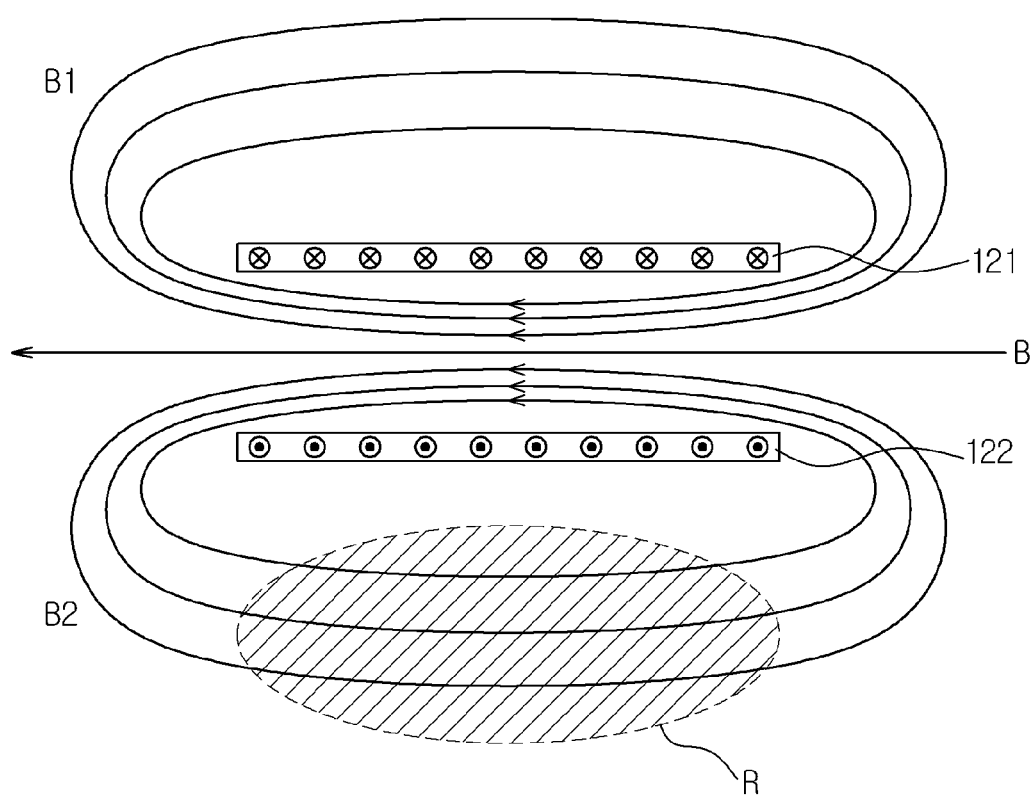
FIG. 4b is a view illustrating magnetic force lines generated by the first phased array RF coil unit in accordance with an exemplary embodiment of the present invention.

FIGS. 4a and 4b are views illustrating a first phased array RF coil unit in accordance with another exemplary embodiment of the present invention. As shown in FIGS. 4a and 4b, a first phased array RF coil unit 100 can include two conductor surfaces disposed opposite to each other, i.e., a first conductor surface 121 and a second conductor surface 122.

The two conductor surfaces 121 and 122 can be disposed in parallel. Of course, both conductor surfaces 121 and 122 are not always disposed in parallel nor is it a requirement to practice the invention. The respective conductor surfaces 121 and 122 can be combined with conductor structures, for example, conductor wires 123a to 123d, at designated points. For example, the first conductor surface 121 is connected to the first conductor wire 123a or the second conductor wire 123b at a first point 123a1 or a second point 123b1. In the same manner, the second conductor surface 122 is connected to the first conductor wire 123a or the second conductor wire 123b at a third point 123a2 or a fourth point 123b2. Consequently, the first conductor surface 121 and the second conductor surface 122 can be electrically connected through the conductor structures, for example, the conductor wires 123a to 123d.

When current supplied from the power supply 310 is applied through, for example, the second conductor wire 123b, sheet type current J flows in the first conductor surface 121 and the second conductor surface 122. In other words, a sheet type current density is formed. Here, sheet type current "J" flowing in the first conductor surface 121 and sheet type current flowing in the second conductor surface 122 flow in opposite directions, as shown in FIG. 4a, and magnetic fields B1 and B2 having a component vertical to the Z-axis are generated according to sheet type current J along the two conductor surfaces 121 and 122, as shown in FIG. 4b.

In the same manner as the previous exemplary embodiment, an imaging region "R" is located within a portion of the magnetic field B2, generated by the conductor surface relatively close to the target object (ob), i.e., the second conductor surface 122, in the direction of the target object (ob), for example, a portion of the magnetic field B2 located under the second conductor surface 122 of FIG. 4b. In other words, if the first phased array RF coil unit 100 is formed, as shown in FIGS. 4a and 4b, the magnetic field including a component vertical to the static magnetic field to which the target object (ob) is exposed, is generated under the conductor surface close to the target object (ob), for example, the second conductor surface 122, and thus a proper magnetic resonance imaging signal can be received.

In this case, a wide area magnetic field having the X-axis component or the Y-axis component can be obtained, and thus a wide region in which the receive sensitivity to a magnetic resonance signal is high can be obtained.

Figure 5A:
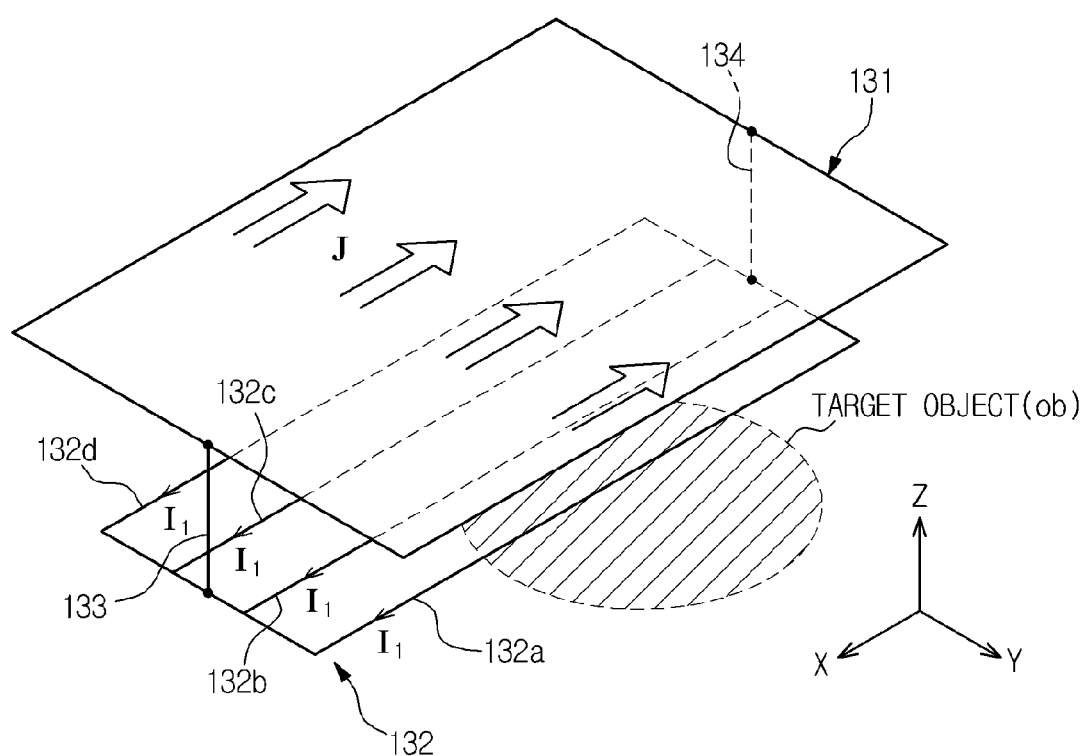
FIGS. 5a and 5b are views of a first phased array RF coil unit in accordance with another exemplary embodiment of the present invention.
Figure 5B:
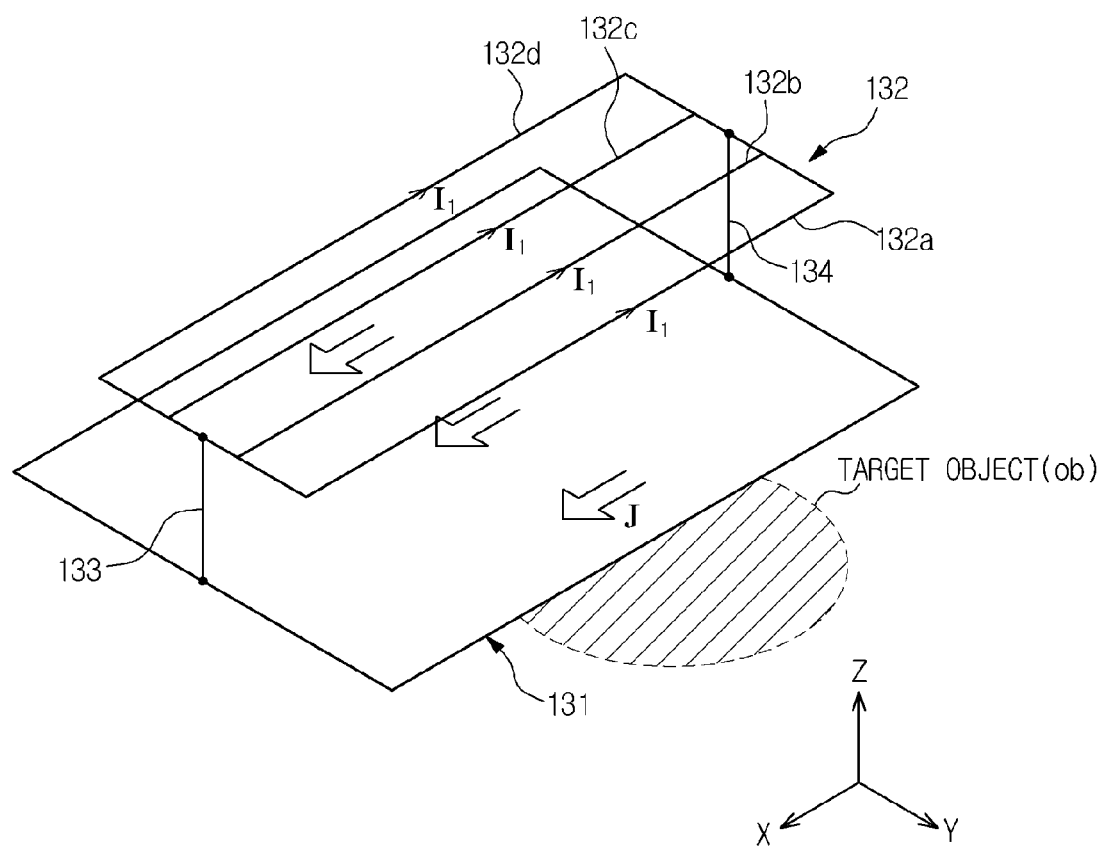
Figure 5C:
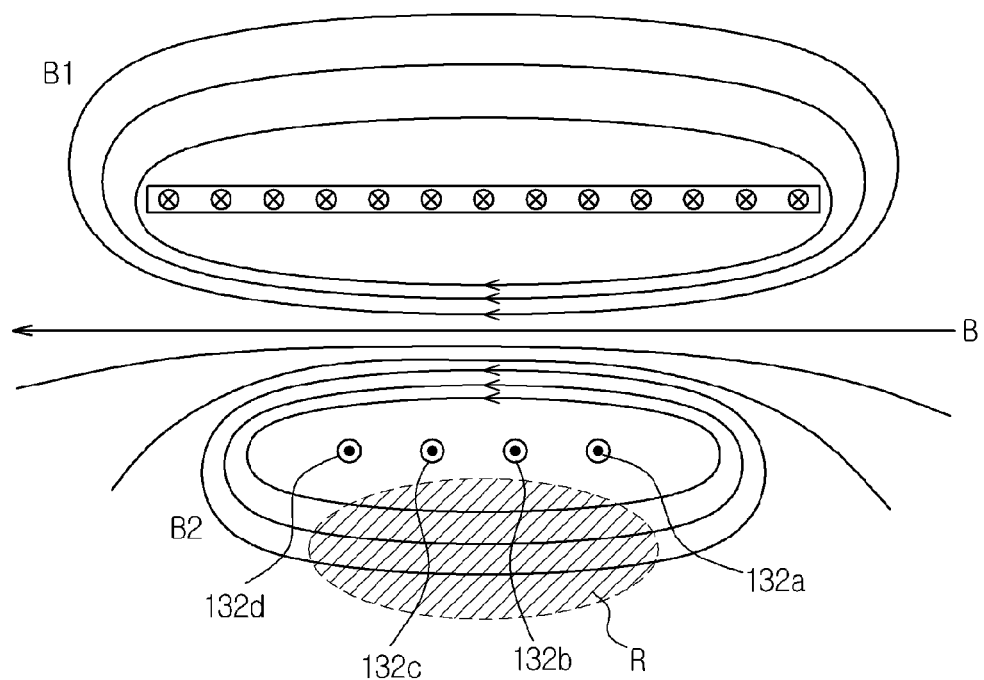
FIG. 5c is a view illustrating magnetic force lines generated by the first phased array RF coil unit in accordance with an exemplary embodiment of the present invention.

FIGS. 5a to 5c are views illustrating a first phased array RF coil unit in accordance with another exemplary embodiment of the present invention. As shown in FIGS. 5a and 5b, a first phased array RF coil unit 100 can include at least one conductor surface 131 and a conductor wire group 132 formed by arranging a plurality of conductor wires 132a to 132d in parallel. Here, the plurality of conductor wires 132a to 132d of the conductor wire group 132 can be connected in parallel.

According to exemplary embodiments, the conductor surface 131 and the conductor wire group 132 can be disposed opposite to each other. In this case, the conductor surface 131 and the conductor wire group 132 can be disposed in parallel. However, an artisan should appreciate that in the present invention the loop conductor surface 131 and the conductor wire group 132 are not always disposed in parallel, and respective virtual lines connected to the conductor surface 131 and the conductor surface group 132 can cross each other at a designated external point. Further, the conductor surface 131 and the conductor wire group 132 can be disposed such that the conductor wire group 132 is relatively closer to the target object (ob) than conductor surface 131 in accordance with one exemplary embodiment, as shown in FIG. 5a, or can be disposed such that the conductor surface 131 is relatively closer to the target object (ob) than the conductor wire group 132 in accordance with another exemplary embodiment, as shown in FIG. 5b.

The conductor surface 131 and the conductor wire group 132 can be electrically connected through conductor structures, for example, conductor wires 133 and 134. At least one of the conductor wires 133 and 134 connecting the conductor surface 131 and the conductor wire group 132 can be connected to the external power supply, as described in a previous exemplary embodiment, as shown in FIGS. 3a and 3b or FIGS. 4a and 4b. Hereinafter, in the description of the first phased array RF coil unit 100, the external power supply will be omitted from the accompanying drawings.

When the external power supply supplies current, the supplied current is introduced into the first phased array RF coil unit 100 through, for example, one conductor wire 133. Then, current $I_1$ flows in the respective conductor wires 132a to 132d of the conductor wire group 132, and a sheet type current J flows in the first conductor surface 131. If the respective conductor wires 132a to 132d are connected in parallel, current $I_1$ flowing in the respective conductor wires 132a to 132d of the conductor wire group 132 can have intensity obtained by dividing the intensity of the introduced current by the number of the conductor wires 132a to 132d of the conductor wire group 132. For example, if the conductor wire group 132 includes four conductor wires, as shown in FIG. 5a, the intensity of current $I_1$ flowing in the respective conductor wires 132a to 132d can be a quarter of the intensity of the introduced current. However, if resistances of the respective conductor wires 132a to 132d are different, the intensities of current flowing in the respective conductor wires 132a to 132d can be different.

In this case, current $I_1$ flowing in the conductor wire group 121 and sheet type current J flowing in the first conductor surface 131 flow in opposite directions, as shown in FIG. 5a. Consequently, magnetic fields B1 and B2 having a component vertical to the Z-axis are generated, as shown in FIG. 5c.

If the conductor wire group 132 is closer to the target object (ob) than the conductor surface 131, as shown in FIG. 5a, an imaging region R for magnetic resonance imaging is located within a portion of the magnetic field B2 closer to the target object (ob), among the magnetic fields B1 and B2 generated by the conductor surface 131 and the conductor wire group 132, in the direction of the target object (ob), for example, a portion of the magnetic field B2 located under conductor wire group 132 of FIG. 5c. In other words, if the first phased array RF coil unit 100 includes the conductor surface 131 and the conductor wire group 132 electrically connected to each other and disposed in parallel, a magnetic field including a component vertical to the Z-axis, i.e., the static magnetic field, is generated under the conductor wire group 132 closer to the target object (ob), and thus the first phased array RF coil unit 100 can receive a proper wide area magnetic resonance imaging signal. In the same manner, if the conductor surface 131 is closer to the target object (ob) than the conductor wire group 132, as shown in FIG. 5b, a magnetic field including a component vertical to the Z-axis, i.e., the static magnetic field, is generated under the conductor surface 131 closer to the target object (ob) than the conductor wire group 132, and thus the first phased array RF coil unit 100 can receive a proper wide area magnetic resonance imaging signal.

If the first phased array RF coil unit 100 includes the conductor surface 131 and the conductor wire group 132, as described above, concentration of sheet type current on the end of the conductor surface can be prevented, and thus a magnetic field can be stably generated.

If the conductor wire group 132 includes a sufficiently large amount of conductor wires, the first phased array RF coil unit 100 in accordance with this exemplary embodiment can generate magnetic fields which are substantially the same as, or similar to the magnetic fields generated by the first phased array RF coil unit 100 in accordance with a previous exemplary embodiment shown in FIGS. 4a and 4b and described herein above.

FIGS. 6a to 6d are views illustrating a first phased array RF coil unit in accordance with another exemplary embodiment of the present invention. As shown in FIGS. 6a to 6d, a first phased array RF coil unit 100 can include a first conductor wire group 141 formed by arranging a plurality of conductor wires 141a to 141e in parallel and a second conductor wire group 142 formed by arranging a plurality of conductor wires 142a to 142d in parallel. Here, the plurality of conductor wires 141a to 141e and 142a to 142d of the respective conductor wire groups 141 and 142 can be connected in parallel, as shown in FIGS. 6a to 6d.

According to this exemplary embodiment, the first conductor wire group 141 and the second conductor wire group 142 can be disposed opposite to each other. In this case, although the first conductor wire group 141 and the second conductor wire group 142 can be disposed in parallel, according to various exemplary embodiments, the first conductor wire group 141 and the second conductor wire group 142 can be disposed such that respective virtual lines connected to the first conductor wire group 141 and the second conductor wire group 142 can cross each other at a designated external point.

Figure 6A:
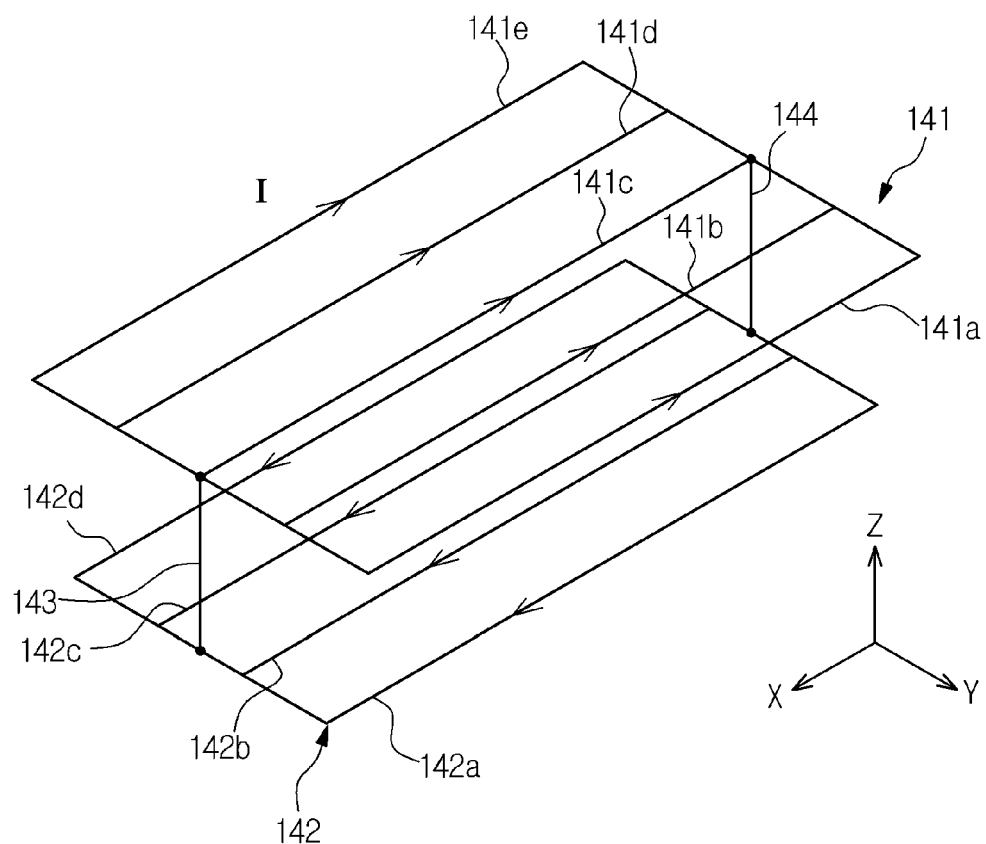
FIGS. 6a and 6b are views of a first phased array RF coil unit in accordance with another exemplary embodiment of the present invention.

In accordance with an exemplary embodiment, the first conductor wire group 141 and the second conductor wire group 142 can also include a different number of conductor wires for each conductor wire group 141a to 141e and 142a to 142d, as shown in FIG. 6a. For example, the first conductor wire group 141 can include five conductor wires 141a to 141e, and the second conductor wire group 142 can include four conductor wires 142a to 142d. In this case, the first phased array RF coil unit 100 can be designed such that the conductor wire group 141 having a larger number of conductor wires 141a to 141e is closer to the target object (ob), than the other group of conductor wires, or can be designed such that the conductor wire group 142 having a smaller number of conductor wires 142a to 142d is closer to the target object (ob) than the other group of conductor wires.

Figure 6B:
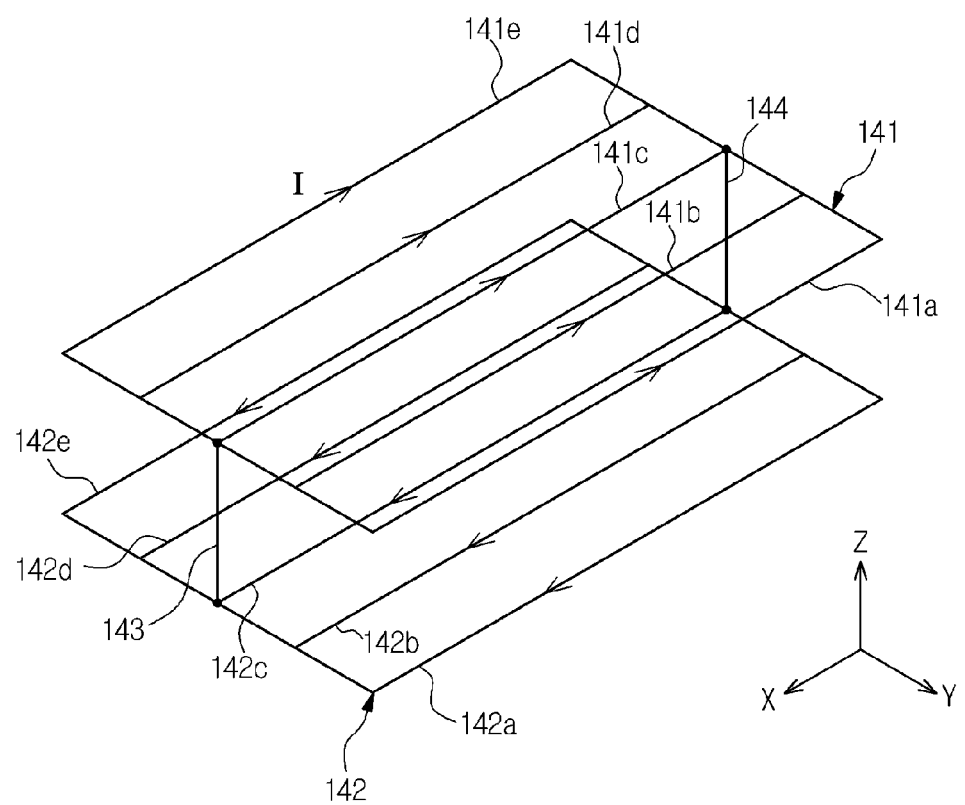

In accordance with another exemplary embodiment, the first conductor wire group 141 and the second conductor wire group 142 can include the same number of conductor wires for each group 141a to 141e and 142a to 142e, as shown in FIG. 6b. For example, the first conductor wire group 141 and the second conductor wire group 142 can include five conductor wires 141a to 141e and 142a to 142e.

The numbers of the conductor wires 141a to 141e and 142a to 142e of the first conductor wire group 141 and the second conductor wire group 142 can be determined such that a uniform magnetic field is formed in an imaging region R through electromagnetic numerical analysis.

The first conductor wire group 141 and the second conductor wire group 142 can be electrically connected through conductor structures, for example, conductor wires 143 and 144. At least one of the conductor wires 143 and 144 can be connected to the external power supply, as described above.

Figure 6C:
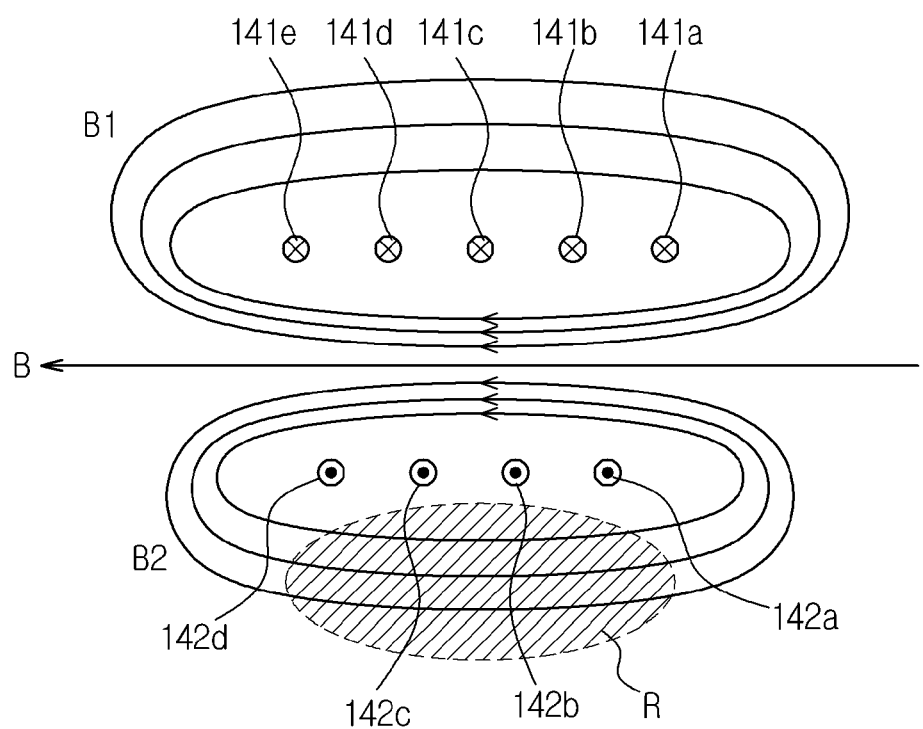
FIG. 6c is a view illustrating magnetic force lines generated by the first phased array RF coil unit in accordance with an exemplary embodiment of the present invention.
Figure 6D:
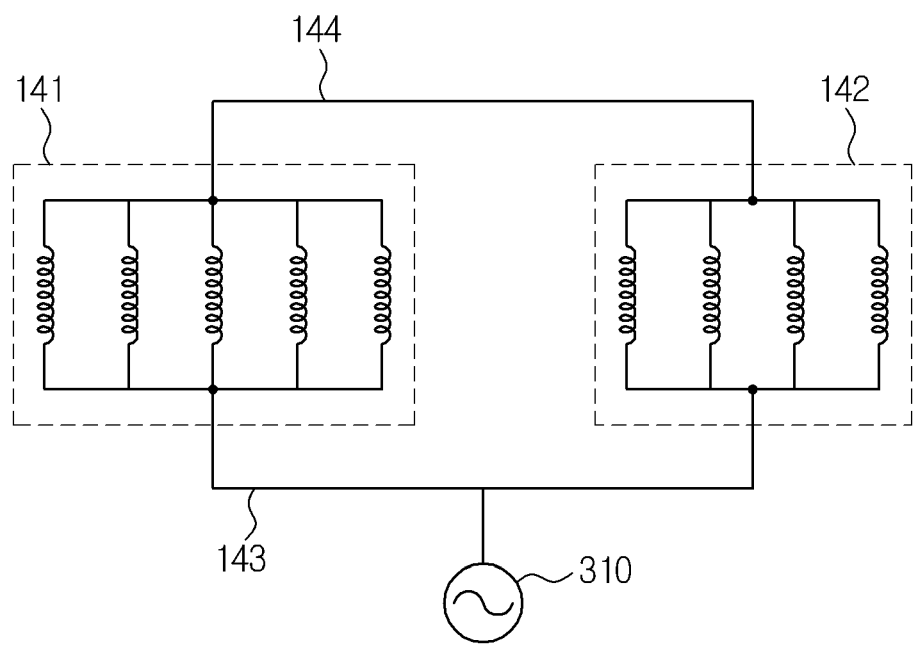
FIG. 6d is a circuit diagram of the first phased array RF coil unit in accordance with an exemplary embodiment of the present invention.

In the same manner as the above description, when the power supply 310 supplies current, as shown in FIG. 6d, the supplied current is introduced into one of the first conductor wire group 141 and the second conductor wire group 142 of the first phased array RF coil unit 100 through one conductor wire 143 or 144. Then, current flows along the plurality of conductor wires 141a to 141e of the first conductor wire group 141 and the plurality of conductor wires 142a to 142d of the second conductor wire group 142.

In this case, current flowing along the plurality of conductor wires 141a to 141e of the first conductor wire group 141 and current flowing along the plurality of conductor wires 142a to 142d of the second conductor wire group 142 flow in opposite directions, as shown in FIG. 6a. Consequently, magnetic fields B1 and B2 having a component vertical to the Z-axis are generated, as shown in FIG. 6c.

An imaging region R is located under the conductor wire group closest to the target object (ob) among the plural conductor wire groups 141 and 142, for example, the second conductor wire group 142, as shown in FIG. 6c. In other words, if the first phased array RF coil unit 100 includes a plurality of conductor wire groups, for example, the first conductor wire group 141 and the second conductor wire group 142, generates a magnetic field including a component vertical to the Z-axis, i.e., the static magnetic field, i.e., the X-axis component and/or the Y-axis component, under the second conductor wire group 142 closest to the target object (ob), and thus can receive a proper magnetic resonance imaging signal at high receive sensitivity through the conductor wire group closest to the target object (ob), for example, the second conductor wire group 142.

If the first phased array RF coil unit 100 includes the first conductor wire group 141 and the second conductor wire group 142 electrically connected to each other and disposed opposite to each other, vibration or noise due to Lorentz force caused by eddy current can be prevented, and a lowering of performance of gradient magnetic fields can be prevented.

Figure 7A:
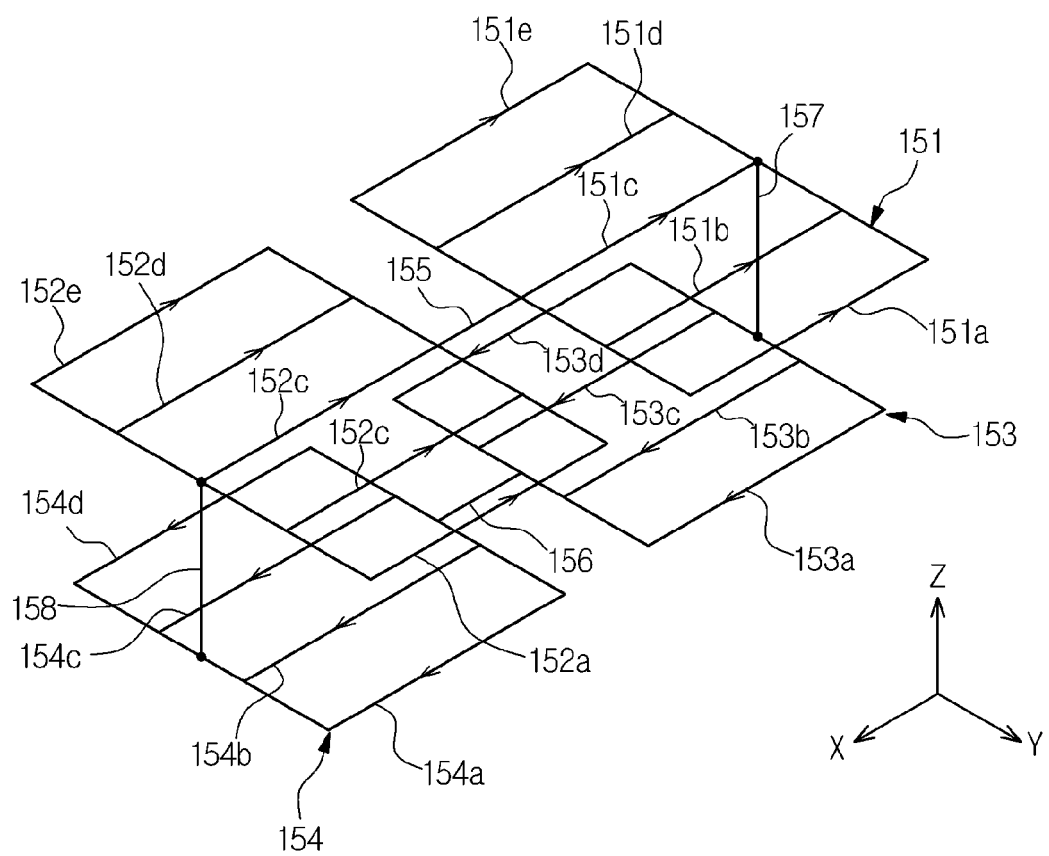
FIG. 7a is a view of a first phased array RF coil unit in accordance with another exemplary embodiment of the present invention.
Figure 7B:
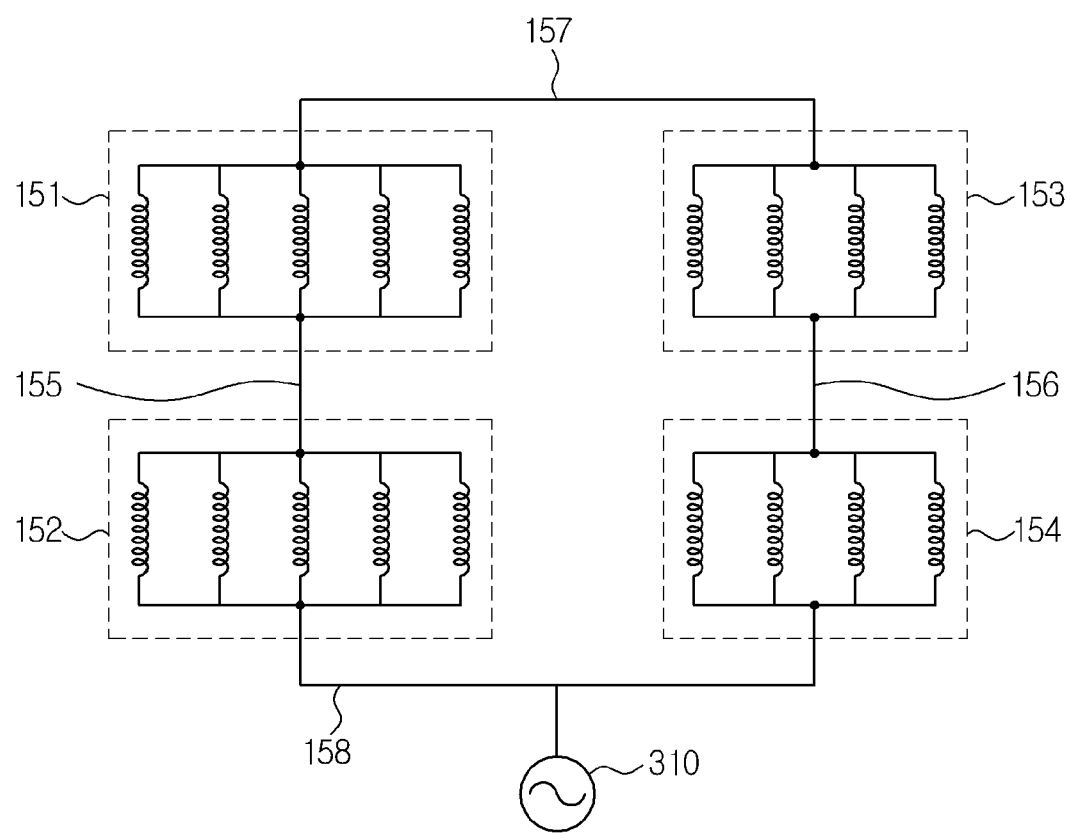
FIG. 7b is a circuit diagram of the first phased array RF coil unit in accordance with an exemplary embodiment of the present invention.

FIGS. 7a and 7b are views illustrating a first phased array RF coil unit in accordance with another exemplary embodiment of the present invention. As shown in FIGS. 7a and 7b, a first phased array RF coil unit 100 can include four conductor wire groups, i.e., the first to fourth conductor wire groups 151 to 154.

The respective conductor wire groups 151 and 154 include pluralities of conductor wires 151a to 151e, 152a to 152e, 153a to 153d and 154a to 154d arranged in parallel. The pluralities of conductor wires 151a to 151e, 152a to 152e, 153a to 153d and 154a to 154d of the respective conductor wire groups 151 and 154 can be electrically connected in parallel, as shown in FIG. 7a or 7b.

The first conductor wire group 151 and the second conductor wire group 152 are disposed closest to each other and are sequentially connected to each other. The first conductor wire group 151 and the second conductor wire group 152 are electrically connected in series through a conductor structure, for example, a first conductor wire 155. Further, the third conductor wire group 153 and the fourth conductor wire group 154 are disposed closest to each other and are sequentially connected to each other. The third conductor wire group 153 and the fourth conductor wire group 154 are electrically connected in series through a conductor structure, for example, a second conductor wire 156.

The first and second conductor wire groups 151 and 152 and the third and fourth conductor wire groups 153 and 154 are installed opposite to each other, as shown in FIG. 7a. The first and second conductor wire groups 151 and 152 and the third and fourth conductor wire groups 153 and 154 can be disposed in parallel with each other.

In accordance with an exemplary embodiment, the first to fourth conductor wire groups 151 to 154 can include different numbers of conductor wires or include the same number of conductor wires, and at least two conductor wire groups, for example, the first conductor wire group 151 and the second conductor wire group 152, of the plurality of conductor wire groups 151 to 154 can include the same number of conductor wires 151a to 151e and 152a to 152e.

For example, as shown in FIGS. 7a and 7b, the first conductor wire group 151 and the second conductor wire group 152 can include five conductor wires 151a to 151e and 152a to 152e, and the third conductor wire group 153 and the fourth conductor wire group 154 can include four conductor wires 153a to 153d and 154a to 154d. In this case, the first phased array RF coil unit 100 can be installed on the phased array RF coil module 10 such that the first conductor wire group 151 and the second conductor wire group 152 are closest to the target object (ob), or be installed on the phased array RF coil module 10 such that the third conductor wire group 153 and the fourth conductor wire group 154 are closest to the target object (ob). In any event, the quantities of wires per group are well as the quantity of groups are merely illustrative for explanatory purposes and the claims are not limited to these quantities.

In the same manner as the above description, the numbers of the conductor wires of the first to fourth conductor wire groups 151 to 154 can be determined such that a uniform magnetic field is formed in an imaging region R through electromagnetic numerical analysis.

As shown in FIG. 7b, the first conductor wire group 151 in this example is connected to the third conductor wire group 153 through a conductor structure, for example, a third conductor wire 157, and the second conductor wire group 152 is connected to the fourth conductor wire group 154 through a conductor structure, for example, a fourth conductor wire 158. At least one of the third and fourth conductor wires 157 and 158 can be connected to the external power supply 310, as described above.

The power supply 310 supplies current to, for example, the second conductor wire group 152, through, for example, the fourth conductor wire 158, as shown in FIG. 7b. Then, current flowing along the second conductor wire group 152, specifically, the respective conductor wires 152a to 152e of the second conductor wire group 152 flows sequentially through the first conductor wire group 151 connected to the second conductor wire group 152 in series, the third conductor wire group 153 and the fourth conductor wire group 154. Consequently, the direction of current flowing in the first conductor wire group 151 and the second conductor wire group 152 and the direction of current flowing in the third conductor wire group 153 and the fourth conductor wire group 154 are opposite, as shown in FIG. 7a. Therefore, magnetic fields B1 and B2 having a component vertical to the Z-axis are generated by current flowing in the first conductor wire group 151 and the second conductor wire group 152 and current flowing in the third conductor wire group 153 and the fourth conductor wire group 154, identically with the description of FIG. 6c.

As described above, an imaging region R is located under the conductor wire groups closest to the target object (ob) among the plurality of conductor wire groups 151 to 154, for example, portions of the third conductor wire group 153 and the fourth conductor wire group 152 in the direction of the target object (ob), i.e., under the third conductor wire group 153 and the fourth conductor wire group 152. In other words, the first phased array RF coil unit 100 in accordance with this exemplary embodiment generates a magnetic field including a component vertical to the Z-axis, i.e., the X-axis component and/or the Y-axis component, under the third conductor wire group 143 and the fourth conductor wire group 144, and thus can receive a magnetic resonance imaging signal.

Figure 8A:
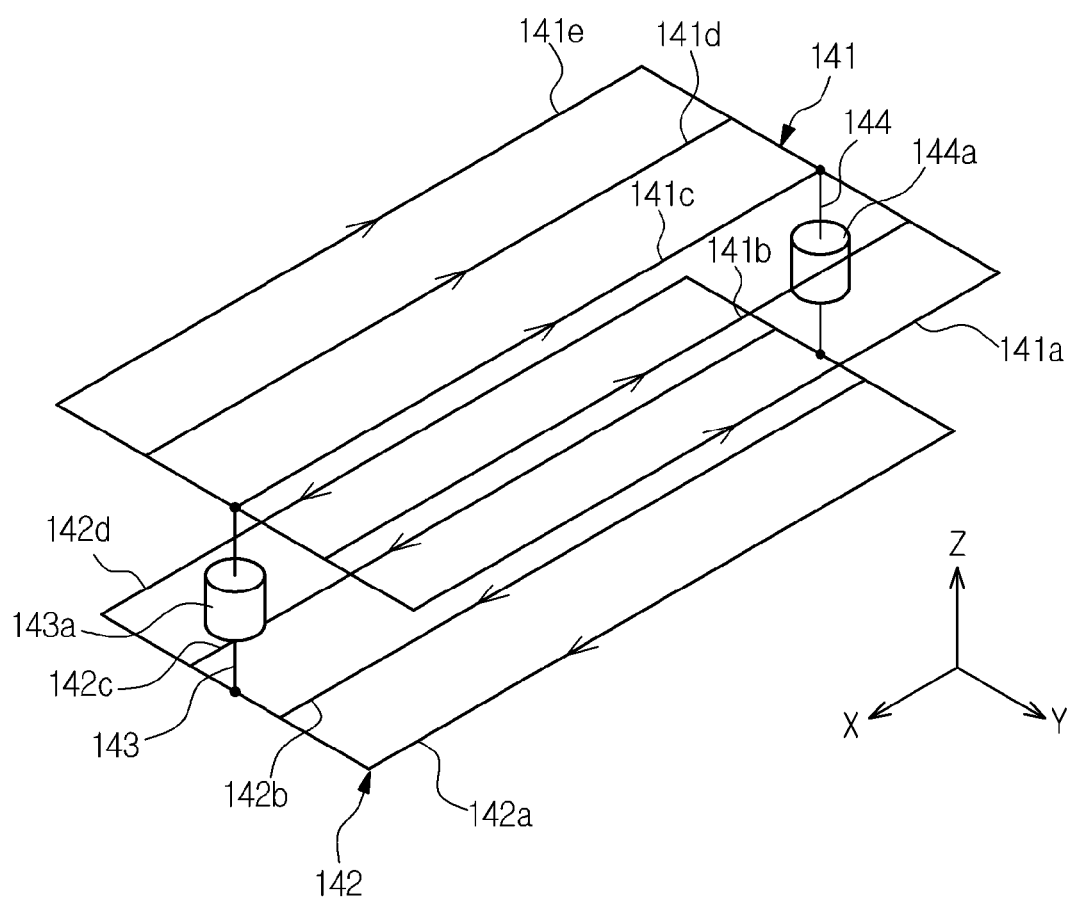
FIG. 8a is a view of a first phased array RF coil unit in accordance with another exemplary embodiment of the present invention.
Figure 8B:
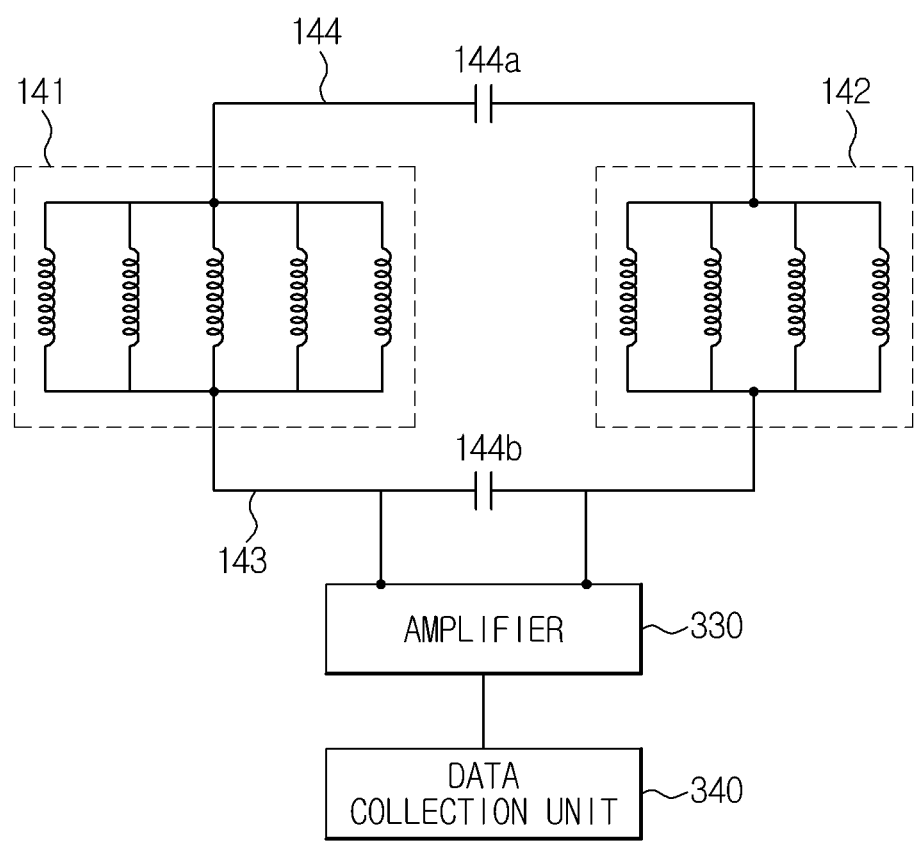
FIG. 8b is a circuit diagram of the first phased array RF coil unit in accordance with an exemplary embodiment of the present invention.
Figure 9A:
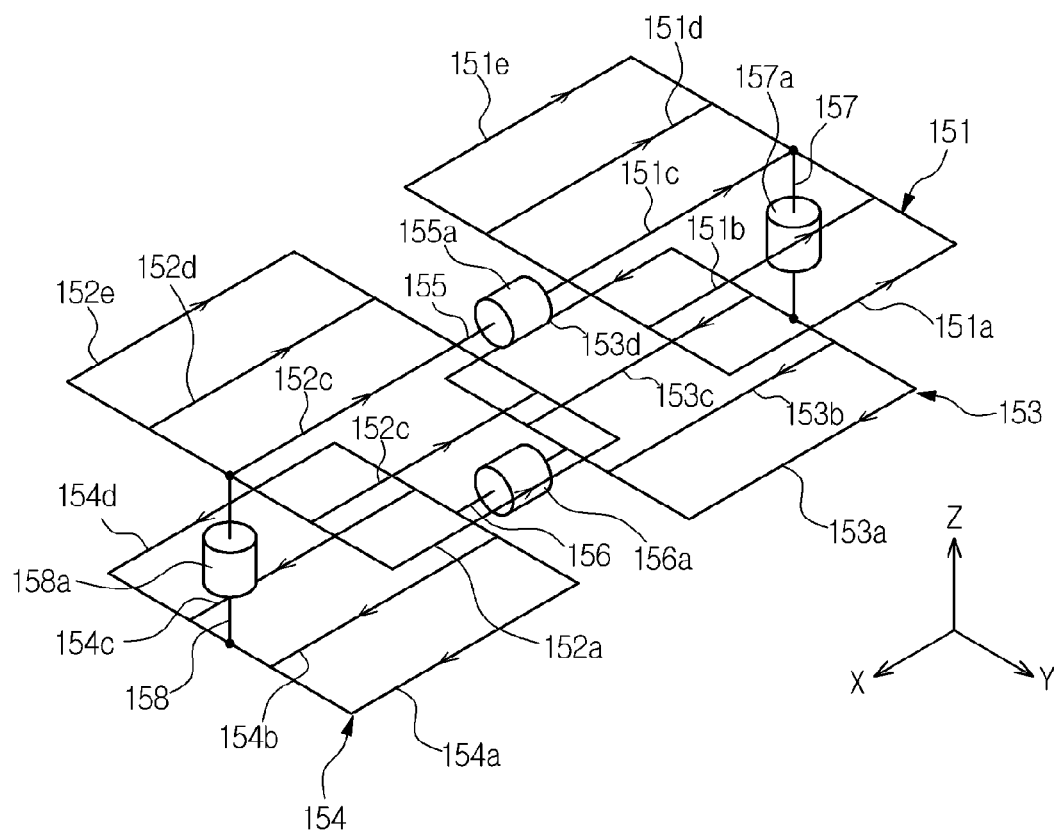
FIG. 9a is a view of a first phased array RF coil unit in accordance with another exemplary embodiment of the present invention.
Figure 9B:
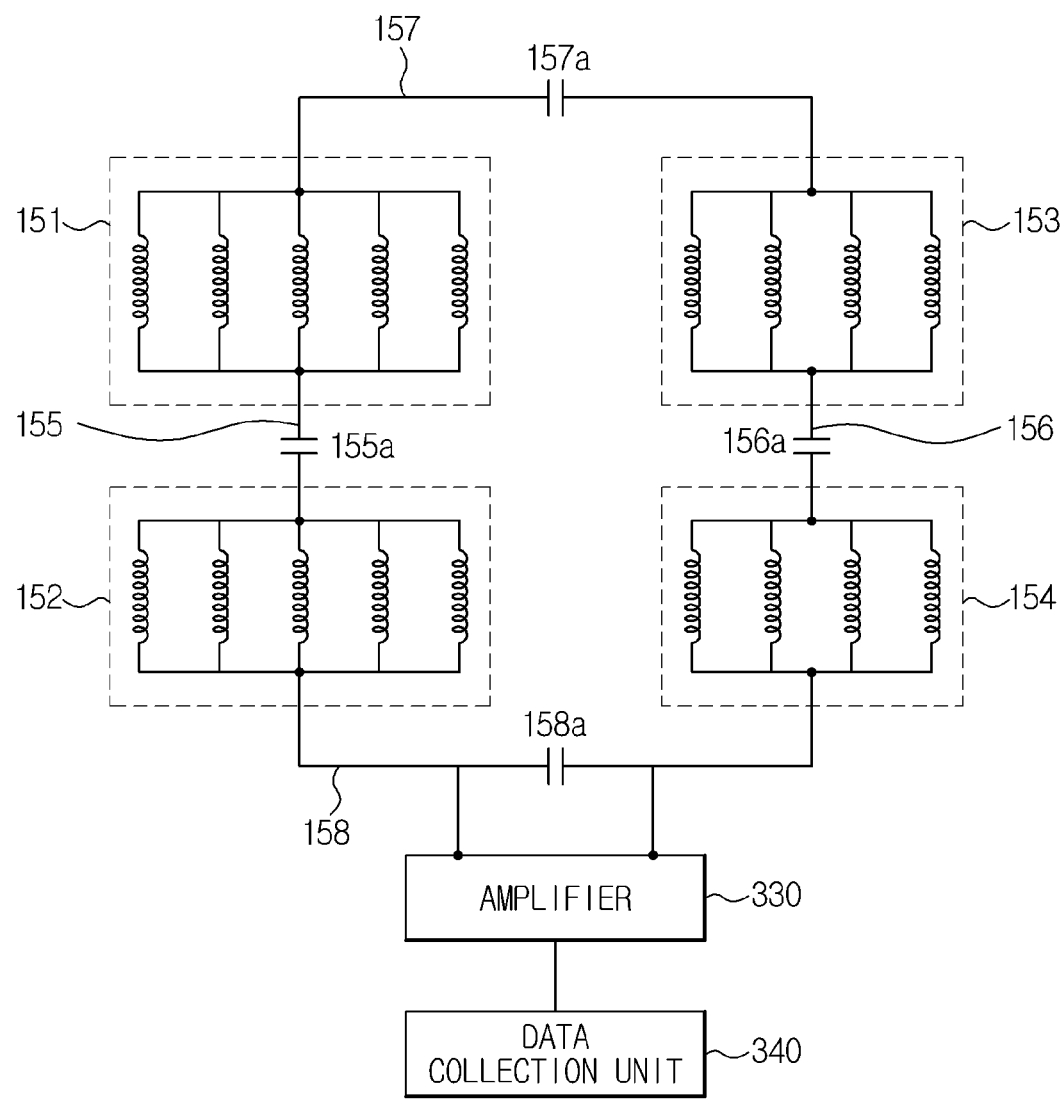
FIG. 9b is a circuit diagram of the first phased array RF coil unit in accordance with an exemplary embodiment of the present invention.

FIGS. 8a and 8b are views illustrating a first phased array RF coil unit in accordance with another exemplary embodiment of the present invention, and FIGS. 9a and 9b are views illustrating a first phased array RF coil unit in accordance with another exemplary embodiment of the present invention. As shown in FIGS. 8a and 8b, a first phased array RF coil unit 100 can further include at least one condenser, for example, a first condenser 144a and a second condenser 144b, in addition to a first conductor wire group 141 and a second conductor wire group 142. The condensers 144a and 144b can be installed on conductor structures connecting the first conductor wire group 141 and the second conductor wire group 142, for example, conductor wires 143 and 144. Coils of the first phased array RF coil unit 100 can be divided by the condensers 144a and 144b. An amplifier 330 can be combined with the conductor wire 143 or 144 with which the condenser 144a or 144b is combined, for example, the conductor wire 143 with which the second condenser 144b is combined, as shown in FIG. 8b. Since the condensers 144a and 144b and the amplifier 330 can reduce electromagnetic coupling between coil elements, for example, respective coil elements of the first phased array RF coil unit 100 and the second phased array RF coil unit 200, as well as amplify a magnetic resonance imaging signal, the first phased array RF coil unit 100 can effectively receive the magnetic resonance imaging signal. This will be described later.

In the same manner, as shown in FIGS. 9a and 9b, a first phased array RF coil unit 100 can further include condensers, for example, a third condenser 155a and a fourth condenser 155b, combined with a conductor wire 155 connecting a first conductor wire group 151 and a second conductor wire group 152 and a conductor wire 156 connecting a third conductor wire group 153 and a fourth conductor wire group 154. Further, a fifth condenser 157a and a sixth condenser 158a can be combined with a conductor wire 157 connecting the first conductor wire group 151 and the third conductor wire group 153 and a conductor wire 158 connecting the second conductor wire group 152 and the fourth conductor wire group 154. In this case, an amplifier 330 can be combined with one of the conductor wire 157 with which the fifth condenser 157a is combined and the conductor wire 158 with which the sixth condenser 158a is combined. As described above, the condensers 155a to 158a and the amplifier 330 can reduce electromagnetic coupling between coil elements as well as amplify a magnetic resonance imaging signal.

Figure 10:
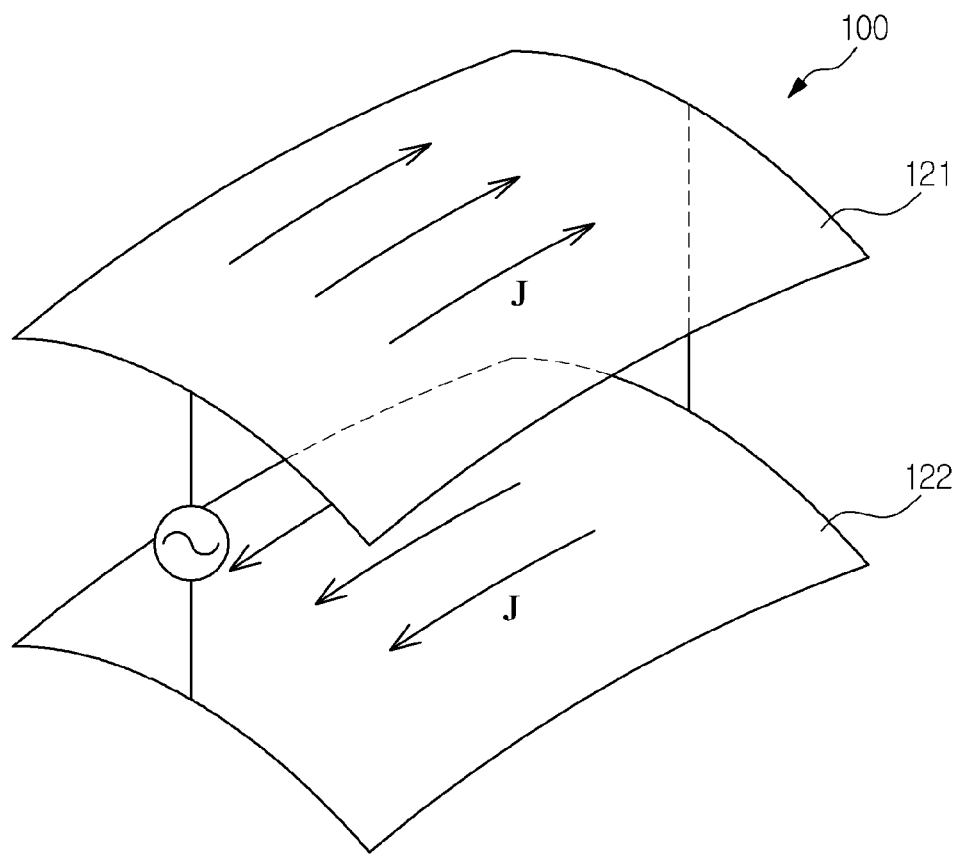
FIG. 10 is a view of a first phased array RF coil unit in accordance with another exemplary embodiment of the present invention.

FIG. 10 is a view of a first phased array RF coil unit in accordance with another exemplary embodiment of the present invention. A first phased array RF coil unit 100 can be bent at a designated curvature. For example, if the first phased array RF coil unit 100 is combined with the helmet-shaped phased array RF coil module 10, as shown in FIGS. 2a to 2c, the first phased array RF coil unit 100 needs to be bent at a designated curvature so that the phased array RF coil module 10 can be formed in a helmet shape or be stably combined with a helmet-shaped housing. Therefore, if the first phased array RF coil unit 100 includes two conductor surfaces 121 and 122 electrically connected to each other and disposed opposite to each other in accordance with the embodiment shown in FIGS. 4a and 4b, the first phased array RF coil unit 100 can be bent at a designated curvature, as shown in FIG. 10. Although not shown in the drawings, the first phased array coil units 100 in accordance with other above-described exemplary embodiments than the embodiment shown in FIGS. 4a and 4b can be bent at a designated curvature.

Figure 11A:
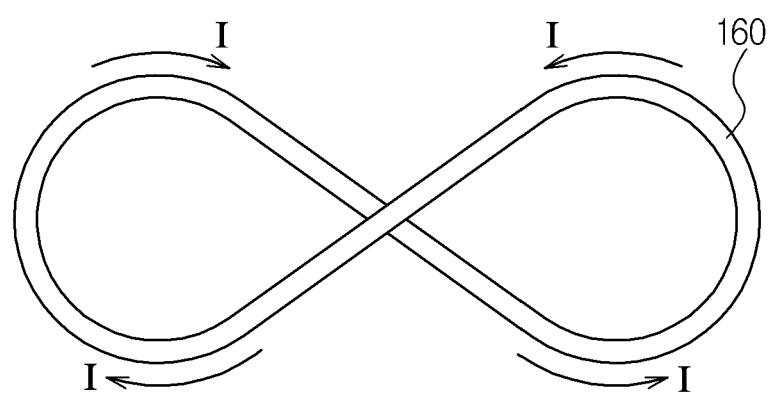
FIG. 11a is a view of a first phased array RF coil unit in accordance with another exemplary embodiment of the present invention.
Figure 11B:
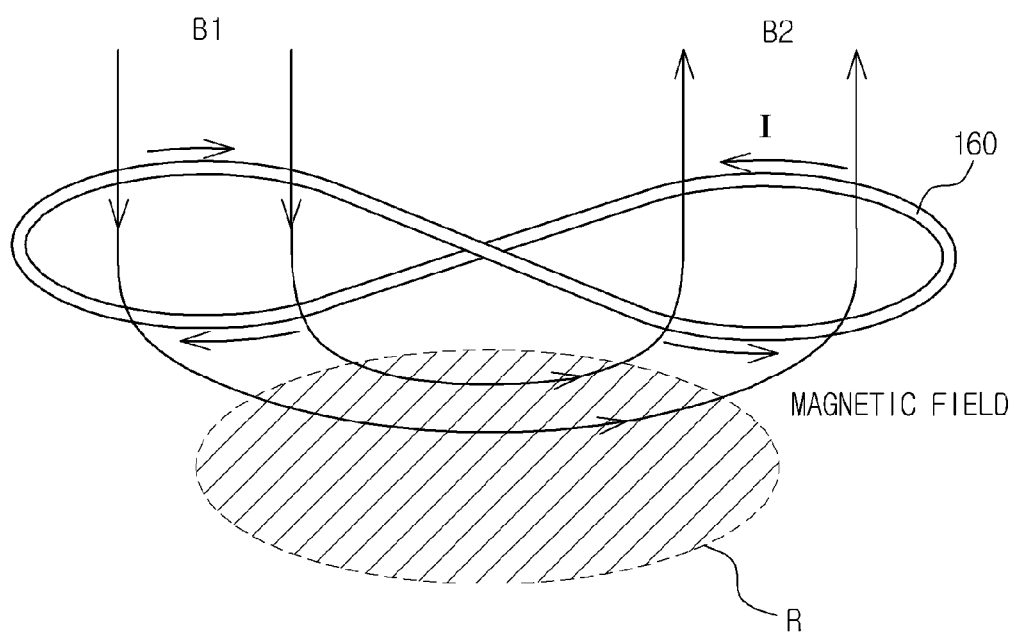
FIG. 11b is a view illustrating magnetic force lines generated by the first phased array RF coil unit in accordance with an exemplary embodiment of the present invention.
Figure 12:
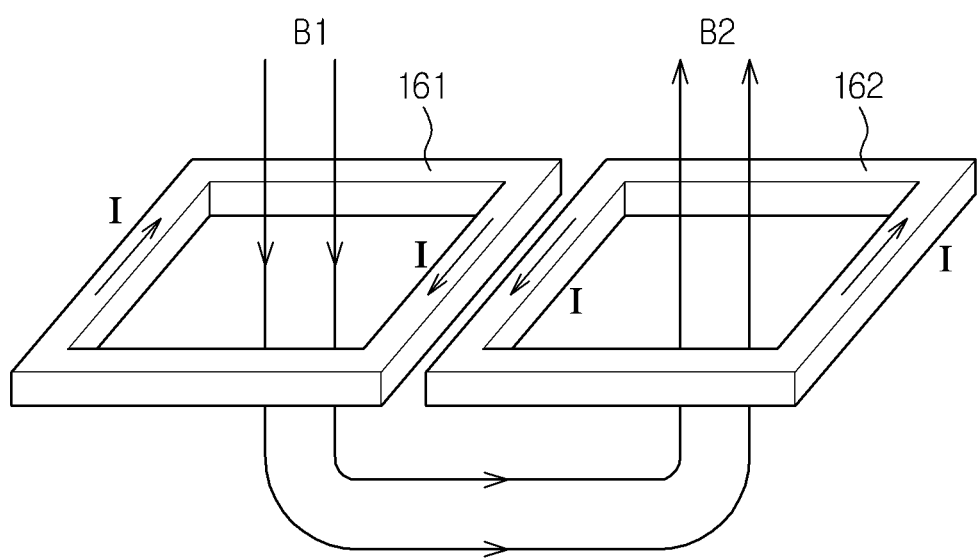
FIG. 12 is a view of a first phased array RF coil unit in accordance with a further exemplary embodiment of the present invention.

FIGS. 11a and 11b and FIG. 12 are views illustrating first phased array RF coil units in accordance with other embodiment of the present invention. As shown in FIGS. 11a to 12, a first phased array RF coil unit 100 can include two loop structures disposed adjacent to each other so as to form magnetic fields B1 and B2 in opposite directions.

The two loop structures can be formed by one conductor wire 160, as shown in FIGS. 11a and 11b, or be formed by two conductor wires 161 and 162, as shown in FIG. 12.

If the first phased array RF coil unit 100 includes one conductor wire 160 forming the two loop structures, the conductor wire 160 can be formed in a figure eight shape, as shown in FIGS. 11a and 11b. If the conductor wire 160 is formed in the figure eight shape, current flowing along the left or right loop of the figure eight shape also flows along the right or left loop. However, the directions of current flowing along the left loop and the right loop are opposite. For example, when current flowing in the left loop travels in the clockwise direction, current flowing in the right loop travels in the counterclockwise direction, as shown in FIG. 11a. Then, a magnetic field B1 in the downward direction is generated at the left loop and a magnetic field B2 in the upward direction is generated at the right loop according to Ampere's right-handed screw rule, as shown in FIG. 11b. Here, a magnetic field having a component horizontal with the first phased array RF coil unit 100 is formed under the figure eight-shaped first phased array RF coil unit 100.

Therefore, if the figure eight-shaped first phased array RF coil unit 100 is orthogonal to the direction of the Z-axis, for example, the static magnetic field, a magnetic field having the X-axis component and the Y-axis component orthogonal to the Z-axis is generated, and thus the figure eight-shaped first phased array RF coil unit 100 can receive a magnetic resonance imaging signal generated from the target object (ob) at high receive sensitivity.

If the first phased array RF coil unit 100 includes plural conductor coils 161 and 162 two neighboring loop structures, as shown in FIG. 12, when current travelling in opposite directions flows along the plural conductor coils 161 and 162, magnetic fields B1 and B2 in opposite directions are generated in the same manner as the above description. Then, a magnetic field having a component horizontal with the first phased array RF coil unit 100 is formed under the first phased array RF coil unit 100.

Therefore, if the first phased array RF coil unit 100 including the plural conductor wires 161 and 162, as shown in FIG. 12 is installed on the phased array RF coil unit 10 orthogonally to the Z-axis, a magnetic field having the X-axis component and the Y-axis component orthogonal to the Z-axis is generated, and thus the first phased array RF coil unit 100 can receive a magnetic resonance imaging signal generated from the target object (ob) at high receive sensitivity, According to the exemplary embodiments, the plural conductor wires 161 and 162 can be formed in a rectangular shape, as shown in FIG. 12, a circular shape, a hexagonal shape or other polygonal shapes.

Figure 13:
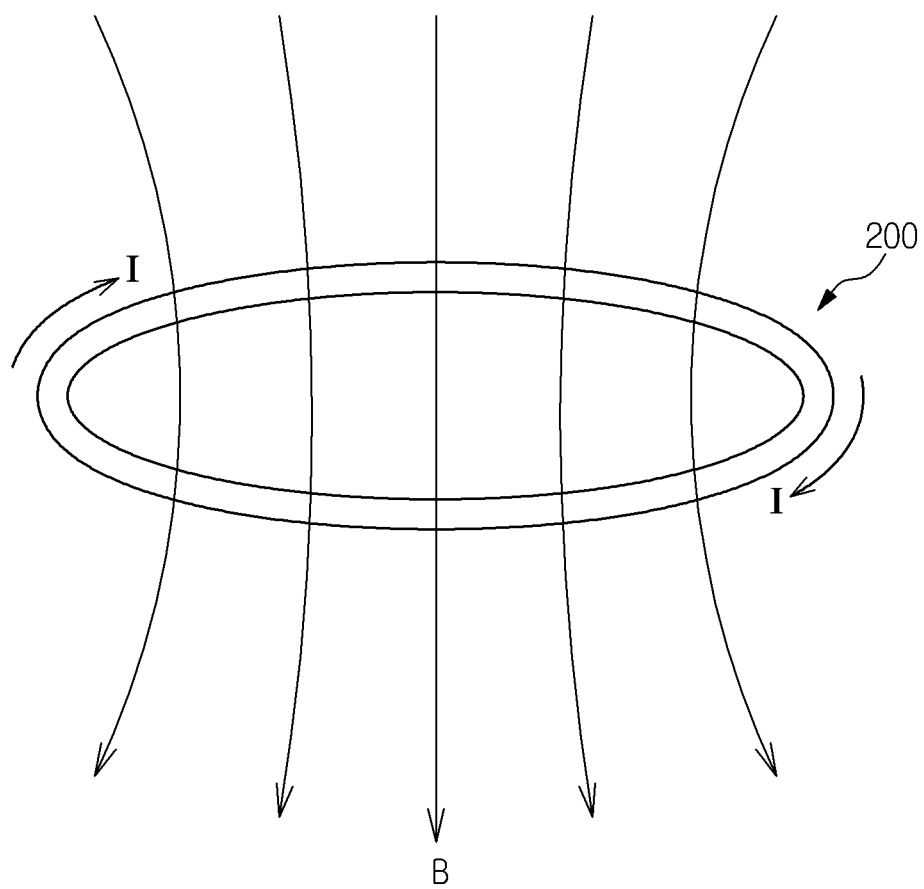
FIG. 13 is a view of a second phased array RF coil unit in accordance with an exemplary embodiment of the present invention.

FIG. 13 is a view of a second phased array RF coil unit in accordance with one embodiment of the present invention. As shown in FIG. 13, a second phased array RF coil unit 20 can include a plurality of coil elements, each of which includes at least one conductor wire formed in a circular or hexagonal shape. Here, the coil elements can be loop coils. When current travels along the circular or hexagonal conductor wire, a magnetic field is generated in the circular or hexagonal inner space. If current I flows along the conductor wire in the clockwise direction of FIG. 13, a magnetic field B in the downward direction of FIG. 13 is generated according to Ampere's right-handed screw rule.

Although not shown in the drawings, the plural coil elements of the second phased array RF coil unit 200 can have a 2d planar shape, or have designated curvatures according to positions of the coil elements installed on the helmet-shaped phased array RF coil module 10. For example, a coil element disposed at a position of the helmet-shaped phased array RF coil module 10, curvature of which is large, can have the corresponding curvature.

The respective coil elements, for example, the loop coils, of the second phased array RF coil unit 200 can overlap with other coil elements, as shown in FIGS. 2a to 2c.

Referring back to FIG. 1, the phased array RF coil module 10 can be connected to the amplifier 330 according to various exemplary embodiments. In order to allow the phased array RF coil module 10 to effectively receive a magnetic resonance imaging signal, the amplifier 330 is connected to the phased array RF coil module 10.

According to various exemplary embodiments, the amplifier 330 can be connected to both the first phased array RF coil unit 100 and the second phased array RF coil unit 200 of the phased array RF coil module 10. Further, the phased array RF coil module 10 can be connected to plural amplifiers 330, and separate amplifiers 300 can be respectively assigned to the first phased array RF coil unit 100 and the second phased array RF coil unit 200. In this case, the respective amplifiers 330 can be electrically connected to the first phased array RF coil unit 100 and the second phased array RF coil unit 200, separately. Further, the amplifier 330 can be connected to only one of the first phased array RF coil unit 100 and the second phased array RF coil unit 200.

Figure 14:
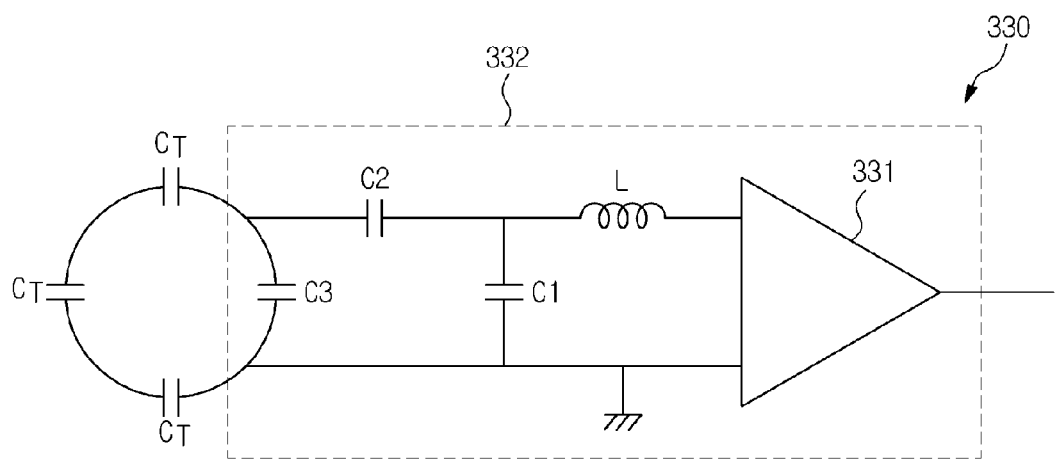
FIG. 14 is a circuit diagram of an amplifier in accordance with an exemplary embodiment of the present invention.

The amplifier 330 connected to the phased array RF coil unit 10 can include, for example, a low noise pre-amplifier 331, as shown in FIG. 14.

Electromagnetic coupling between the coil elements can be reduced using the amplifier 330. FIG. 14 is a circuit diagram of an amplifier connected to a phased array RF coil module in accordance with one embodiment of the present invention. With reference to FIG. 14, a coil element at the left side, for example, a loop coil, can include plural condensers Ct dividing the loop coil so that current distribution on the coil element is uniform at an operating frequency. When the operating frequency is high, the number of condensers Ct can be increased so as to improve performance of the coil element. According to exemplary embodiments, the coil element at the left side can be the above-described first phased array RF coil unit 100. The above-described exemplary embodiments shown in FIGS. 8a and 8b and FIGS. 9a and 9b illustrate division of the first phased array RF coil unit 100 by plural condensers Ct.

The coil element or the first phased RF coil unit 100 can be connected to the pre-amplifier 331 having a very low input impedance, for example, about 1Ω. In this case, as shown in FIG. 14, plural condensers C1 to C3 and an inductor L are provided between the coil element and the pre-amplifier 331 and thus perform impedance transform. The impedance of the coil element can be increased by more than several hundred times the impedance on the pre-amplifier 330 by adjusting the values of the condensers C1 to C3 and the inductor L. If the amplifier 330 is configured in such a manner, coupling between the coil element and a neighboring coil element can be reduced.

Figure 15:
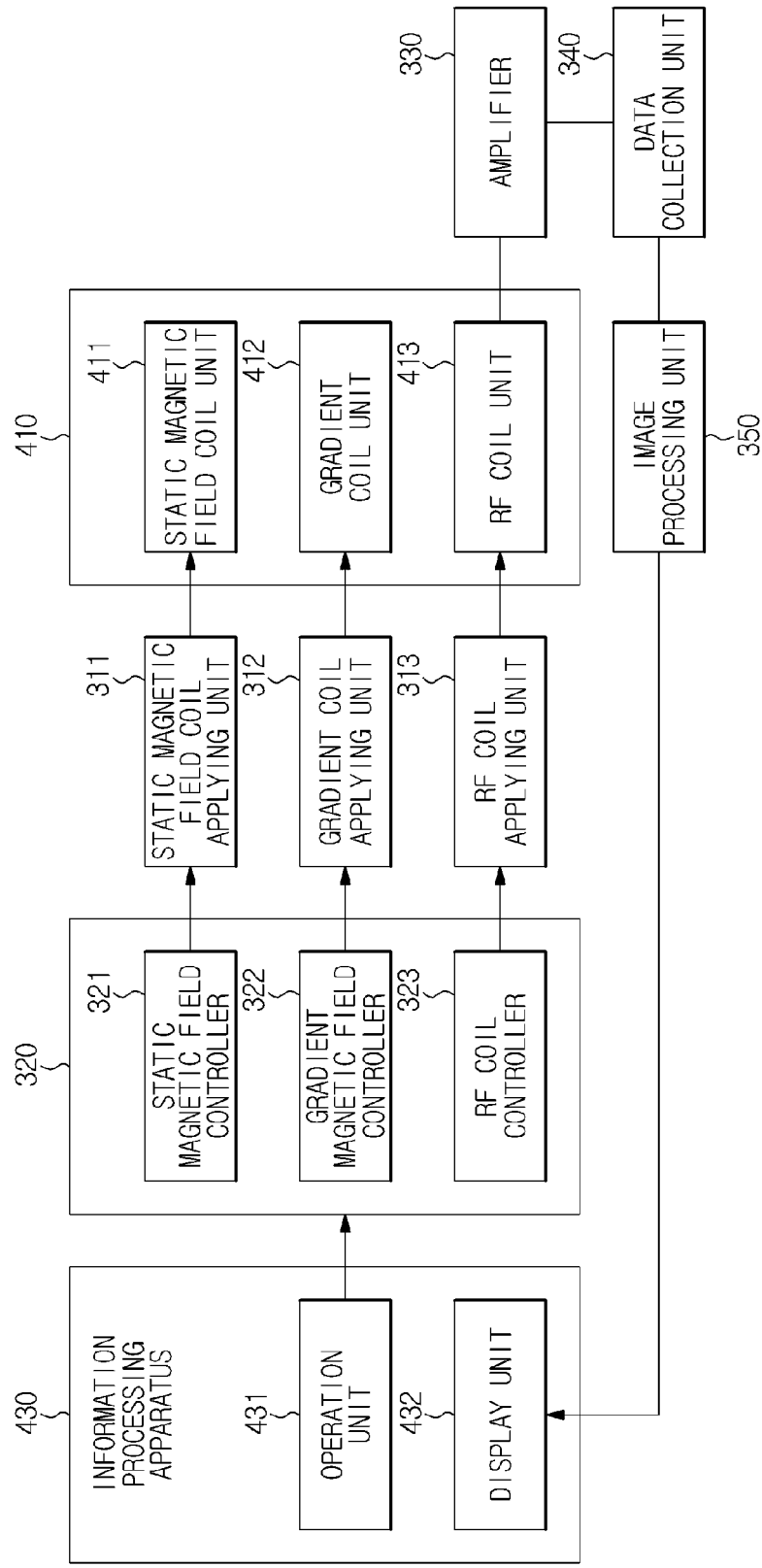
FIG. 15 is a view illustrating the configuration of a magnetic resonance imaging apparatus in accordance with an exemplary embodiment of the present invention.
Figure 16:
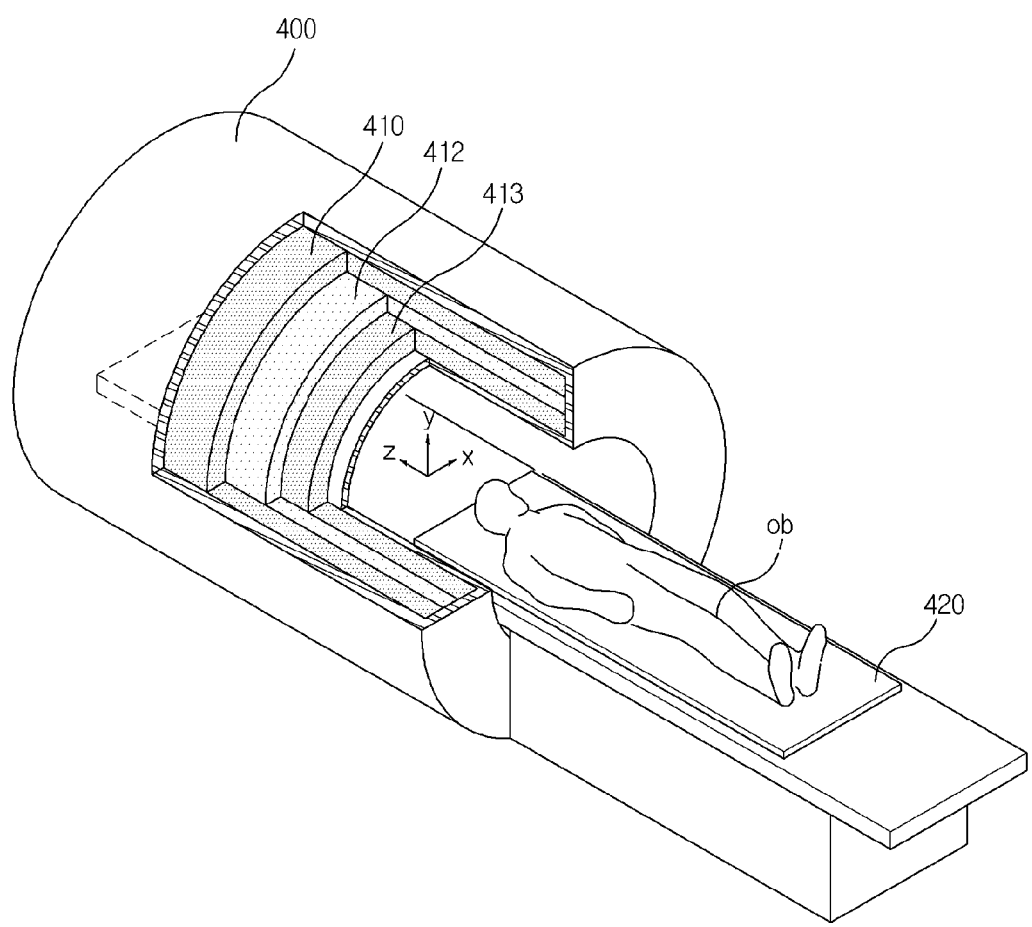
FIG. 16 is a perspective view of the magnetic resonance imaging apparatus in accordance with an exemplary embodiment of the present invention.
Figure 17:
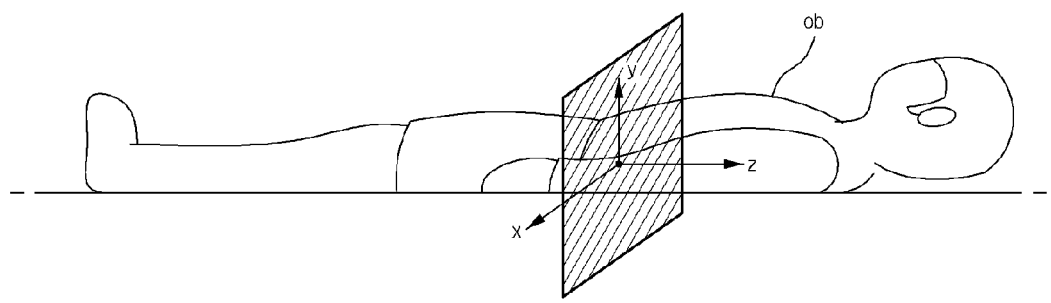
FIG. 17 is a view illustrating an example of the magnetic resonance imaging apparatus.

FIGS. 15 and 16 are views illustrating the configuration of a magnetic resonance imaging apparatus in accordance with an exemplary embodiment of the present invention, and FIG. 17 is a view illustrating the magnetic resonance imaging apparatus. The magnetic resonance imaging apparatus shown in FIGS. 15 and 16 can include a bore 400, a coil control unit 320, an amplifier 330, a data collection unit 340, and an image processing unit 350.

The bore 400 is the main body of the magnetic resonance imaging apparatus, as shown in FIGS. 15 and 16, and when a target object (ob) is placed within the bore 400, the magnetic resonance imaging apparatus executes magnetic resonance imaging of the target object (ob) using magnetic resonance. Specifically, the bore 400 can be provided with a coil unit 410 forming magnetic fields in respect to the target object (ob) and generating resonance of atomic nuclei.

The coil unit 410 can include a static magnetic field coil unit 411, a gradient coil unit 412, and an RF coil unit 413 (in FIG. 16) or 413a (in FIG. 18), as shown in FIGS. 15 and 16.

The static magnetic field coil unit 411 generates a static magnetic field to magnetize nuclei of atoms generating magnetic resonance among atoms distributed in a human body, for example, atoms, such as hydrogen, phosphorous and sodium. The static magnetic field coil unit 411 is formed of a superconductive electromagnet or a permanent magnet. In order to generate a magnetic field of a high flux density of more than 0.5 tesla, a superconductive electromagnet is used. When nuclei of atoms, such as hydrogen, phosphorous and sodium, are exposed to the static magnetic field, the atomic nuclei are magnetized, and a magnetization vector of the atomic nuclei precesses around the static magnetic field.

The static magnetic field generated by the static magnetic field coil unit 411 is generally parallel with the driving axis of the bore 400. In other words, the static magnetic field is formed in the Z-axis direction shown in FIG. 17. If the target object (ob) is a human body, the static magnetic field is generated from the head to the toes of the human body.

The gradient coil unit 412 generates spatially linear gradient magnetic fields in the bore 400. The gradient coil unit 412 can use three kinds of gradient coils forming gradient magnetic fields in the X-axis, Y-axis and Z-axis directions shown in FIG. 17 so as to acquire a magnetic resonance image. The gradient coils spatially control the rotating frequency or phase of the magnetization vector of nuclei of atoms, such as hydrogen, phosphorous and sodium, generated by the main magnetic field when the magnetization vector is rotated on a transverse plane, so that a magnetic resonance imaging signal can be expressed in a spatial frequency region, i.e., a k-space.

The RF coil unit 413 generates a RF magnetic field to rotate the magnetization vector, generated by the static magnetic field, on the transverse plane in parallel with the plane.

The above-described phased array RF coil unit 10 can be used as the RF coil unit 413. As described above, the phased array RF coil unit 10 includes at least one first phased array RF coil unit 100 generating a magnetic field having a component horizontal with the surface of a target object and a second phased array RF coil unit 200 formed in the horizontal direction with the surface of the target object and generating a magnetic field having a component vertical to the surface of the target object. Here, the first phased array RF coil unit 10 can be one of the first phased array RF coil units in accordance with the above-described several embodiments.

When RF current of the Larmor frequency band is applied to the RF coil unit 413 or 413a, the RF coil unit 413 or 413a generates a rotary magnetic field rotated at the Larmor frequency according to the applied RF current. When the rotary magnetic field and the magnetization vector resonate with each other, the magnetization vector is rotated on the transverse plane in parallel with the plane at the Larmor frequency. Here, electromotive force is generated on the RF coils of the RF coil unit 413 according to rotation of the magnetization vector. When the generated electromotive force is amplified by the RF amplifier and sinusoidal waves of the Larmor frequency are demodulated, a magnetic resonance signal of a baseband is acquired. Thereby, the magnetic resonance signal can be received through the RF coil unit 413.

According to various exemplary embodiments, the RF coil unit 413 can include RF coils executing both functions of generating a rotary magnetic field and receiving a magnetic resonance signal, for example, the first phased array RF coil unit 100 or the second phased array RF coil unit 200. Further, the RF coil unit 413 can include plural kinds of RF coils separately executing the functions of generating a rotary magnetic field and receiving a magnetic resonance signal. That is, some of the RF coils of the RF coil unit 413 can be transmitting dedicated coils generating a rotary magnetic field, and others of the RF coils of the RF coil unit 413 can be receiving dedicated coils receiving a magnetic resonance signal.

The coil control unit 320 generates a designated control signal and thus controls operation of the coil unit 410 of the bore 400. The coil control unit 320 can include a static magnetic field controller 321 controlling the static magnetic coil unit 411, a gradient magnetic field controller 322 controlling the gradient coil unit 412, and an RF coil controller 323 controlling the RF coil unit 413.

The respective controllers 321 to 323 of the coil control unit 320 transmit a control signal to a static magnetic field coil applying unit 311, a gradient coil applying unit 312 or an RF coil applying unit 313 according to control instructions input from the outside or stored settings, and the static magnetic field coil applying unit 311, the gradient coil applying unit 312 or the RF coil applying unit 313 having received the control signal applies current to the static magnetic field coil unit 411, the gradient coil unit 412 or the RF coil unit 413 so that the static magnetic field coil unit 411, the gradient coil unit 412 or the RF coil unit 413 can generate magnetic fields in the bore 400.

The amplifier 330 amplifies a magnetic resonance signal generated from atomic nuclei, or reduces coupling between neighboring coil elements of the respective coil elements of the coil unit 410. In accordance with one exemplary embodiment, the above-described amplifier shown in FIG. 14 can be used as the amplifier 330.

The data collection unit 340 detects the phase of the magnetic resonance signal generated from the atomic nuclei or amplified by the amplifier 330, and converts an analog signal acquired through phase detection into a digital signal. According to various exemplary embodiments, the data collection unit 340 can temporarily or non-temporarily store the converted digital signal.

The image processing unit 350 generates a magnetic resonance image based on the acquired data regarding the magnetic resonance image. Specifically, the image processing unit 350 reconfigures the image of the target object (ob) by performing 2*d* inverse Fourier transform upon the acquired data regarding the magnetic resonance image.

The magnetic resonance imaging apparatus can be connected to an information processing apparatus 430. The information processing apparatus 430 can control overall operation of the magnetic resonance imaging apparatus according to user operation using an operation unit 431, for example, a keyboard, a mouse, a touch screen or a track ball. Further, the information processing apparatus 430 can display the magnetic resonance image generated by the image processing unit 350 through a display unit 432, for example, a monitor, to a user.

Figure 18:
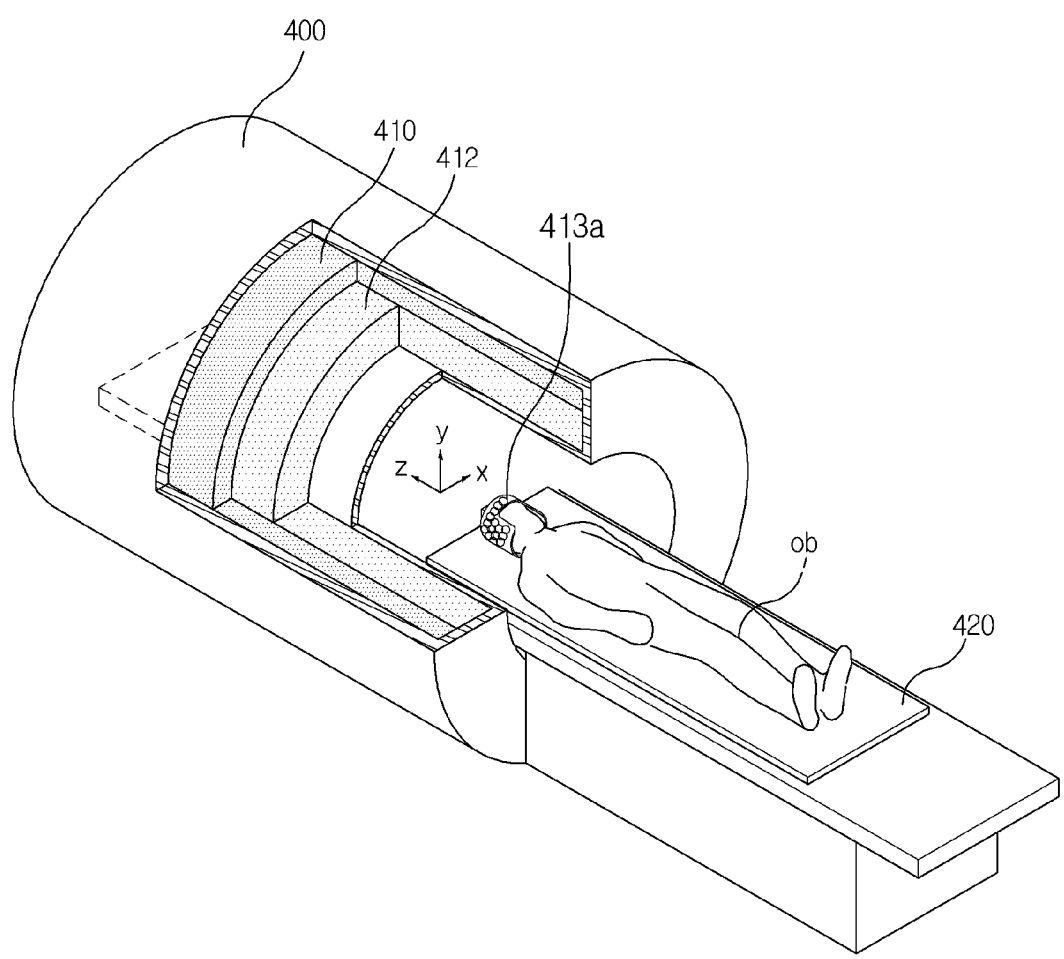
FIG. 18 is a perspective view of a magnetic resonance imaging apparatus in accordance with another exemplary embodiment of the present invention.

FIG. 18 is a perspective view of a magnetic resonance imaging apparatus in accordance with another exemplary embodiment of the present invention.

As shown in FIG. 18, an RF coil unit 413*a* can be installed in a helmet-shaped housing so as to image the head region of a human body. That is, the RF coil unit 413*a* can be the phased array RF coil module 10 shown in FIGS. 2*a* to 2*c*. It is also possible that the person could have worn instead of the coil unit 413*a* on his head, the shoulder and chest guard-shaped RF coil unit 413*b* shown in FIG. 2*d*.

In this case, at least one first phased array RF coil unit 100 can be disposed at the parietal region of the RF coil unit 413*a*, and a second phased array RF coil unit 200 can be disposed at other regions than the parietal region. Then, the first phased array RF coil unit 100 can generate a magnetic field having a component horizontal to the target object (ob), i.e., a magnetic field having the X-axis or Y-axis component shown in FIG. 17, orthogonal to the Z-axis, i.e., the static magnetic field.

In a magnetic resonance image, receive sensitivity of the coil unit is determined only by a magnetic field having a component orthogonal to the static magnetic field generated by the static magnetic field coil unit 411. Therefore, if the second phased array RF coil unit 200 is installed at the parietal region, a magnetic field horizontal with the static magnetic field is generated and thus receive sensitivity of the coil unit can be low. However, as described above, if the first phased array RF coil unit 100 is installed at the parietal region, the first phased array RF coil unit 100 generates a magnetic field having a component orthogonal to the static magnetic field and thus receive sensitivity at the parietal region is improved. Therefore, a signal to noise ratio of a magnetic resonance image at the parietal region is also improved. Therefore, a magnetic resonance image requiring a high signal to noise ratio, such as a functional brain image or a cerebral perfusion image, can be easily acquired.

Figure 19:
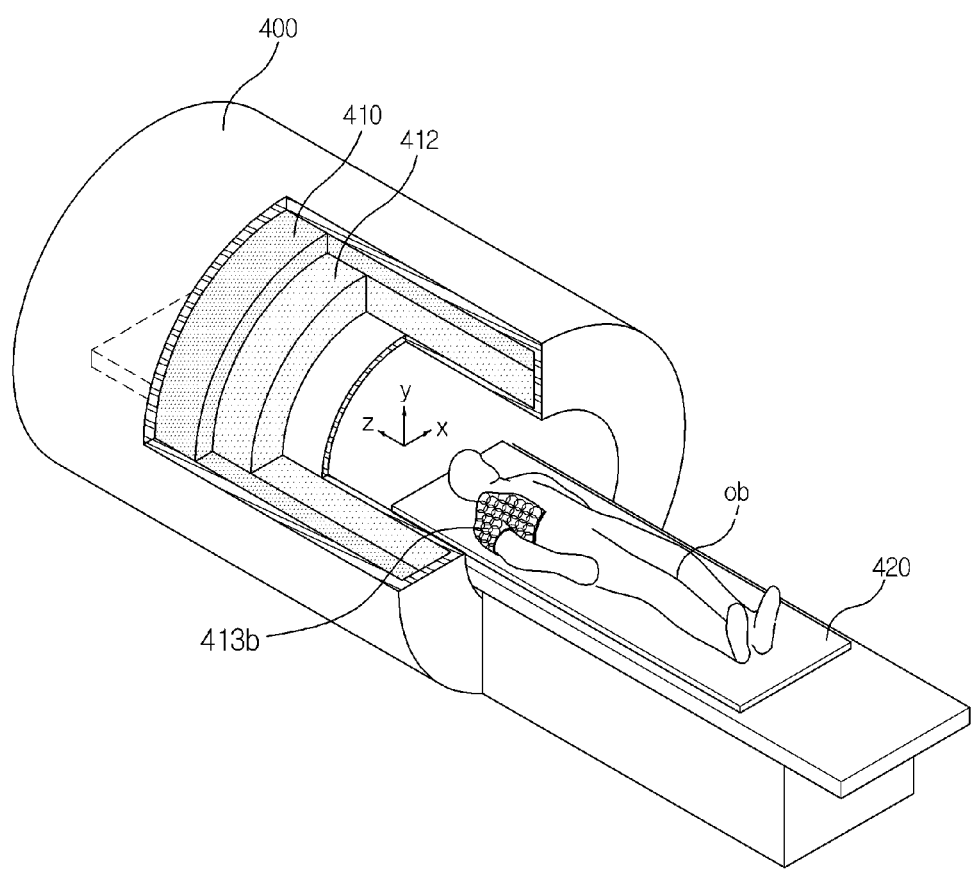
FIG. 19 is a perspective view of a magnetic resonance imaging apparatus in accordance with a further exemplary embodiment of the present invention.

FIG. 19 is a perspective view of a magnetic resonance imaging apparatus in accordance with a further embodiment of the present invention.

As shown in FIG. 19, an RF coil unit 413*b* can have a shoulder and chest guard shape so as to image the shoulder and chest of a human body. That is, the RF coil unit 413*b* can be the phased array RF coil module 10 shown in FIGS. 2*d*. In this case, the RF coil unit 413*b* can be installed on and fixed to a shoulder and chest guard-shaped housing.

In the shoulder and chest guard-shaped RF coil unit 413*b*, at least one first phased array RF coil unit 100 can be installed at the shoulder region of the RF coil unit 413*b*, and a second phased array RF coil unit 200 can be installed at other regions than the shoulder region, for example, the region of the RF coil unit 413*b* installed on the upper arm or the chest part of a human body.

The shoulder region, specifically, the upper end part of the shoulder region, is orthogonal to the direction of the static magnetic field, or has an angle of the static magnetic field almost close to a right angle. In other words, the upper end part of the shoulder region is oriented in the X-axis or Y-axis direction, or oriented in a direction almost close thereto. The first phased array RF coil unit 100 generates a magnetic field having a component horizontal with the surface of the target object (ob). The static magnetic field is parallel with or almost parallel with the Z-axis. Therefore, if the first phased array RF coil unit 100 is installed at the shoulder region, a magnetic field generated by the first phased array RF coil unit 100 includes a component orthogonal to the static magnetic field.

Therefore, as described above, if the first phased array RF coil unit 100 is installed at the shoulder region, the first phased array RF coil unit 100 generates a magnetic field having a component orthogonal to the static magnetic field and thus receive sensitivity at the shoulder region is improved. Further, a signal to noise ratio of a magnetic resonance image at the shoulder region can be also improved.

As is apparent from the above description, a phased array RF coil module and a magnetic resonance imaging apparatus using the same in accordance with an exemplary embodiment of the present invention can receive a magnetic resonance signal generated from a target object at high receive sensitivity and thus improve a signal to noise ratio.

Further, the phased array RF coil module and the magnetic resonance imaging apparatus using the same can prevent lowering of a signal-to-noise ratio generated if a phased array RF coil module including only loop coils is used.

In addition, if the phased array RF coil module is formed in a helmet shape, the helmet-shaped phased array RF coil module can prevent lowering of a signal to noise ratio of a magnetic resonance image at the parietal region. Thereby, a phased array RF coil module and a magnetic resonance imaging apparatus using the same which are adapted to a high signal-to-noise ratio required by imaging of the brain of a human body, for example, functional brain imaging or cerebral perfusion imaging in which 3D images are acquired several times at a high speed and a brain activity level or a cerebral perfusion flow rate is acquired from these time-series images, can be provided.

Further, an imaging time in magnetic resonance imaging can be reduced.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for".

In addition, an artisan understands and appreciates that a "processor" or "microprocessor" comprise hardware in the claimed invention. Under the broadest reasonable interpretation, the appended claims constitute statutory subject matter in compliance with 35 U.S.C. §101. The terms "unit" or "module" as used herein is to be understood under the broadest reasonable interpretation as constituting statutory subject matter under 35 U.S.C. §101 and does not constitute software per se. When a unit or module includes machine executable code it is to be understood that a non-transitory machine readable medium contains the machine executable code that is loaded into hardware such a processor or controller for execution.

Although a few exemplary embodiments of the present invention have been shown and described, it would be appreciated by those skilled in the art that changes can be made in these exemplary embodiments without departing from the principles and spirit of the invention, the scope of which is defined in the claims and their equivalents.

What is claimed is:

1. A phased array RF coil module comprising:
a first phased array RF coil unit defining a plane and configured to generate a magnetic field parallel to the plane; and
a second phased array RF coil unit arranged for generating a magnetic field having a component orthogonal to the plane defined by the first phase array RF.

2. The phased array RF coil module according to claim 1, wherein the first phased array RF coil unit includes two conductor surfaces electrically connected to each other and oppositely disposed to each other.

3. The phased array RF coil module according to claim 1, wherein the first phased array RF coil unit includes at least one conductor surface and a conductor wire group formed by arranging a plurality of conductor wires in parallel, and the at least one conductor surface and the conductor wire group are electrically connected to each other and oppositely disposed to each other.

4. The phased array RF coil module according to claim 3, further comprising condensers installed on conductor structures connecting a first conductor wire group and a second conductor wire group.

5. The phased array RF coil module according to claim 4, wherein coils of the first phased array RF coil unit are divided by the condensers.

6. The phased array RF coil module according to claim 1, wherein the first phased array RF coil unit includes a first conductor wire group formed by arranging a first plurality of conductor wires in parallel and a second conductor wire group formed by arranging a second plurality of conductor wires in parallel, and the first conductor wire group and the second conductor wire group are electrically connected to each other and oppositely disposed to each other.

7. The phased array RF coil module according to claim 1, wherein the first phased array RF coil unit includes two loop structures disposed adjacent to each other to output magnetic fields in opposite directions.

8. The phased array RF coil module according to claim 7, wherein the first phased array RF coil unit includes at least one conductor wire formed in a figure-eight shape.

9. The phased array RF coil module according to claim 1, wherein the second phased array RF coil unit includes a plurality of loop coils combined with each other.

10. The phased array RF coil module according to claim 1, wherein the first phased array RF coil unit and the second phased array RF coil unit are combined in a helmet shape.

11. The phased array RF coil module according to claim 10, wherein the first phased array RF coil unit is formed at a parietal region of the helmet shape.

12. The phased array RF coil module according to claim 1, wherein the first phased array RF coil unit and the second phased array RF coil unit are combined in a shoulder and chest guard shape for placement on a shoulder and chest of a target object.

13. The phased array RF coil module according to claim 12, wherein the first phased array RF coil unit is formed at a shoulder region of the shoulder and chest guard shape.

14. The phased array RF coil module according to claim 1, wherein the first phased array RF coil unit or the second phased array RF coil unit applies electromagnetic waves to a target object.

15. The phased array RF coil module according to claim 1, wherein the first phased array RF coil unit or the second phased array RF coil unit receives a magnetic resonance signal from a target object.

16. A phased array RF coil module comprising:
a first phased array RF coil unit defining a plane and configured to generating a magnetic field having a main component orthogonal to an external magnetic field around a target object exposed to the external magnetic field; and
a second phased array RF coil unit generating a magnetic field orthogonal to the plane defined by the first phase array RF coil unit,
wherein the first phased array RF coil unit and the second phased array RF coil unit are combined in a helmet shape, and the first phased array RF coil unit is formed at a parietal region of the helmet shape.

17. A magnetic resonance imaging apparatus comprising:
a static magnetic field coil unit arranged for forming a static magnetic field around a target object; and
an RF coil unit applying electromagnetic waves to the target object around which the static magnetic field is formed to induce magnetic resonance in the target object, and receiving a magnetic resonance signal generated according to induction of magnetic resonance,
wherein the RF coil unit includes at least one first phased array RF coil unit defining a plane and generating a magnetic field having a component parallel to the plane, and a second phased array RF coil unit generating a magnetic field orthogonal to the plane defined by the at least one first phased array RF coil unit.

18. The magnetic resonance imaging apparatus according to claim 17, wherein the at least one first phased array RF coil unit includes at least one conductor surface and a conductor wire group formed by arranging a plurality of conductor wires in parallel, and the at least one conductor surface and the conductor wire group are electrically connected to each other and oppositely disposed to each other.

19. The magnetic resonance imaging apparatus according to claim 17, wherein the at least one first phased array RF coil unit includes a first conductor wire group formed by arranging a first plurality of conductor wires in parallel and a second conductor wire group formed by arranging a second plurality of conductor wires in parallel, and the first conductor wire group and the second conductor wire group are electrically connected to each other and oppositely disposed to each other.

20. The magnetic resonance imaging apparatus according to claim 17, wherein the at least one first phased array RF coil unit includes two loop structures disposed adjacent to each other to form magnetic fields in opposite directions.

21. The magnetic resonance imaging apparatus according to claim 20, wherein the first phased array RF coil unit includes at least one conductor wire formed in a figure eight shape.

22. The magnetic resonance imaging apparatus according to claim 17, wherein the second phased array RF coil unit includes a plurality of loop coils combined with each other.

23. The magnetic resonance imaging apparatus according to claim 17, wherein the first phased array RF coil unit and the second phased array RF coil unit are combined in a helmet shape.

24. The magnetic resonance imaging apparatus according to claim 23, wherein the first phased array RF coil unit is formed at a parietal region of the helmet shape.

25. The magnetic resonance imaging apparatus according to claim 17, wherein the first phased array RF coil unit and the second phased array RF coil unit are combined in a shoulder and chest guard shape.

26. The magnetic resonance imaging apparatus according to claim 25, wherein the first phased array RF coil unit is formed at a shoulder region of the shoulder and chest guard shape.

27. The magnetic resonance imaging apparatus according to claim 17, wherein the first phased array RF coil unit or the second phased array RF coil unit applies electromagnetic waves to the target object.

28. The magnetic resonance imaging apparatus according to claim 27, wherein the first phased array RF coil unit or the second phased array RF coil unit receives a magnetic resonance signal from the target object.

29. A magnetic resonance imaging apparatus comprising:
a static magnetic field coil unit arranged for forming a static magnetic field around a target object; and
an RF coil unit including a first phased array RF coil unit defining a plane and generating a magnetic field having a component parallel to the plane and a second phased array RF coil unit generating a magnetic field having a component orthogonal to the plane defined by the at least one first phase array RF coil unit,
wherein the first phased array RF coil unit and the second phased array RF coil unit are combined in a helmet shape, and the first phased array RF coil unit is formed at a parietal region of the helmet shape.

\* \* \* \* \*